US006847232B2

United States Patent
Tinsley et al.

(10) Patent No.: US 6,847,232 B2
(45) Date of Patent: Jan. 25, 2005

(54) INTERCHANGEABLE CML/LVDS DATA TRANSMISSION CIRCUIT

(75) Inventors: Steven Tinsley, Garland, TX (US); James Dietz, Prosper, TX (US); Mark Morgan, Allen, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/059,987

(22) Filed: Jan. 29, 2002

(65) Prior Publication Data

US 2003/0085736 A1 May 8, 2003

Related U.S. Application Data

(63) Continuation-in-part of application No. 10/008,039, filed on Nov. 8, 2001, now abandoned.

(51) Int. Cl.$^7$ .......................................... H03K 19/0175
(52) U.S. Cl. .............................. 326/84; 326/86; 326/89; 326/91
(58) Field of Search .............................. 326/82–84, 86, 326/89, 90, 91

(56) References Cited

U.S. PATENT DOCUMENTS

| | | | | |
|---|---|---|---|---|
| 5,592,510 A | * | 1/1997 | Van Brunt et al. | 375/220 |
| 6,107,882 A | * | 8/2000 | Gabara et al. | 330/253 |
| 6,111,431 A | | 8/2000 | Estrada | |
| 6,281,715 B1 | | 8/2001 | DeClue et al. | |
| 6,292,031 B1 | * | 9/2001 | Thompson et al. | 327/66 |
| 6,369,621 B1 | * | 4/2002 | Tinsley et al. | 327/108 |

OTHER PUBLICATIONS

"Low Voltage Differential Signaling (LVDS) Technology: The Basics", Semiconductor News and Publications, reprinted from the Internet at: http://www.ti.com/sc/docs/news/1998/98068b.htm, 3 pages, no date.

"techWeb: The Business Technology Network", reprinted from the Internet at: http://www.techweb.com/encyclopedia/defineterm?term=LVDS&x=21&y=11, 3 pages, no date.

"LVDS Product Family Introductions", National Semiconductor, reprinted from the Internet at: http://www.national.com/appinfo/lvds/0.1798.115.00.html, 2 pages, no date.

"LVDS", Webopedia.com, reprinted from the Internet at: http://www.pcwebopedia.com/TERM/L/LVDS/html, 2 pages, no date.

* cited by examiner

Primary Examiner—Anh Q. Tran
(74) Attorney, Agent, or Firm—W. Daniel Swayze, Jr.; W. James Brady; Frederick J. Telecky, Jr.

(57) ABSTRACT

A system and method is described for a driver circuit used for high speed data transmission in LVDS and CML transceiver device applications. The transceivers are intended to receive a low voltage differential input signal and interchangeably drive a standard LVDS load with a TIA/EIA-644 compliant LVDS signal, and a standard CML load with a standard CML compatible signal. The driver circuit operates at speeds up to 1.36 Gbps, making it compatible with the OC-24 signaling rate for optical transmission. To accomplish this, the driver uses a mixed combination of voltage and current mode drive sections in the output circuit when coupled to LVDS loads, and when the driver is coupled to CML loads, operates purely in a current mode using only the current mode drive section. MOS transistors and a current source are used in the current mode switch portion to switch the drive with a constant current at the high speeds, and NPN transistors in the voltage mode output portion provide variable impedance for the output circuit. A common mode compensation circuit using a feedback voltage from the load generates a compensation signal for variable impedance control of the NPN transistors to yield a regulated voltage for the common mode dc voltage.

16 Claims, 13 Drawing Sheets

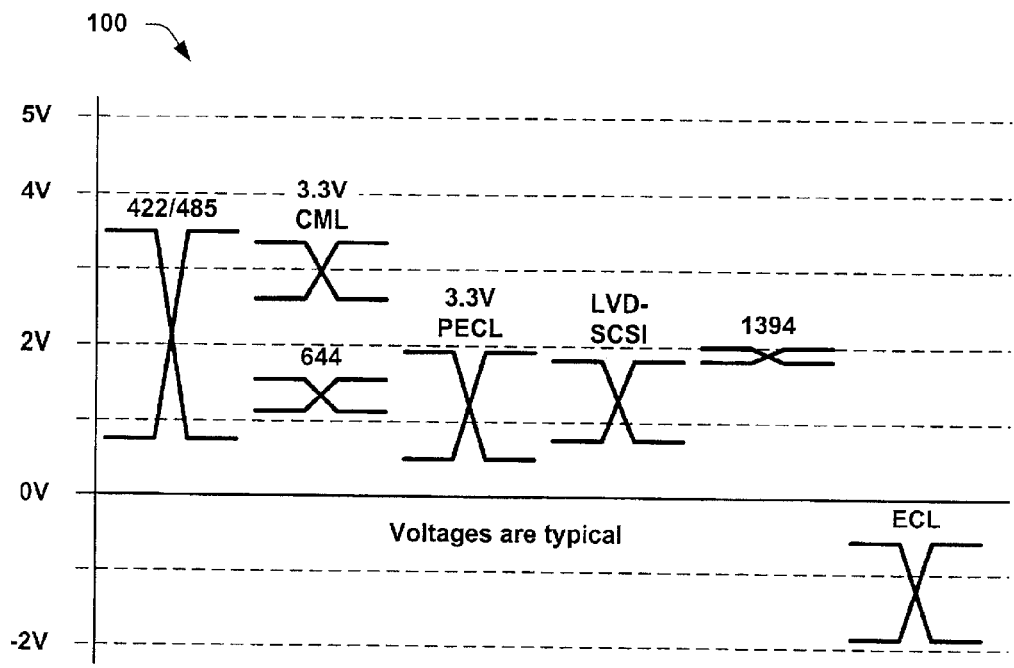
FIGURE 1
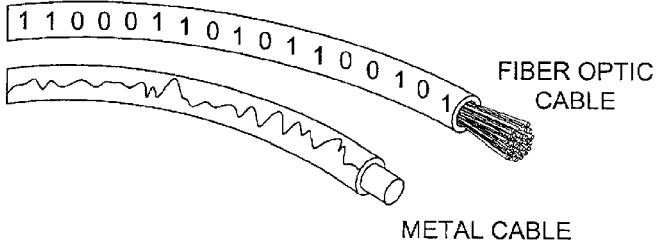
FIGURE 2　　　FIGURE 3

DRIVER RUNNING AT 200MBps.

DRIVER RUNNING AT 1.36GBps.

INTERCHANGEABLE CML/LVDS DATA TRANSMISSION CIRCUIT

RELATED APPLICATION

This application is a Continuation-In-Part of Ser. No. 10/008,039 filed Nov. 8, 2001 now ABN, which is entitled "INNOVATIVE HIGH SPEED LVDS DRIVER CIRCUIT".

TECHNICAL FIELD OF INVENTION

The present invention relates generally to transceiver device applications in the transmission of CML and LVDS level signals. More particularly, the present invention relates to a high speed driver circuit for data transmission of a standard CML or a standard LVDS compatible differential signal, providing high compliance of the common mode output even at high load currents, while maintaining a simple pre-drive circuit design with a wide common mode range.

BACKGROUND OF THE INVENTION

Low Voltage Differential Signaling (LVDS) and Current Mode Logic (CML) standards are two of the most common high-speed data transmission methods used today, and are redefining data transmission at the physical layer interface, and the point-to-point device interface. LVDS and CML are bringing high speeds and low power to these critical interfaces, providing an essential step in meeting the high bandwidth requirements of tomorrow's networking, telecommunications and multimedia applications.

LVDS is a new data interface standard that is defined in the TIA/EIA-644 and the IEEE 1596.3 standards. The TIA/EIA644 standard is also the most common LVDS standard, strictly dictating all of the electrical parameters that must be met by LVDS drivers and receivers. It is essentially a low noise, low power, low amplitude signaling method used for high-speed data transmission of binary data over copper wire. CML is not regulated by standard, but is instead a loose driver output standard based on a particularly simple output protocol. LVDS/CML uses a lower voltage swing than many other transmission standards. Normal digital I/O works with a supply voltage, typically 3.3 volts or 5 volts as a high (binary 1), and 0 volts as a low (binary 0). With LVDS/CML a differential voltage replaces the standard single ended voltage with respect to ground. Standard LVDS (TIA/EIA 644) allows for a differential voltage ($V_{OD}$) of about 350 mV (247 mV to 454 mV) with a common mode output voltage ($V_{OC}$) of about 1.2 volts (1.1V to 1.3V) from ground. With the loose CML standard, ($V_{OD}$) is about 750 mV (700 mV to 800 mV) and the common mode output voltage ($V_{OC}$) is undefined, as it is supply dependant, for example, about 2.55V to 3.3V from ground for a 3.3V supply, which is $V_{OC}=V_{CC}-750$ mV$/2=V_{CC}-375$ mV. This low differential voltage is what delivers higher data transmission speeds and inherently greater bandwidth with lower power consumption. FIG. 1 illustrates typical voltage swings for some of the various transmission standards.

Typically, LVDS/CML can achieve signaling rates as high as 655 megabits per second (Mbps). The ultimate rate and distance of LVDS/CML data transfer is dependent on the attenuation characteristics of the media and the noise coupling to the environment. Generally however, both LVDS and CML work fine for short distances, while LVDS is best suited for greater distances. LVDS also consumes as little as one-eighth the power of RS422 drivers, while CML consumes about 750 mW.

LVDS/CML uses a dual wire (differential) system, running 180 degrees out of phase with each other. This enables noise to travel at the same level as the signal, but common to both wires (common mode), causing the vast majority of the noise to cancel. Since the receivers respond only to differential voltages, they are relatively immune to noise such as common-mode signal reflections. In addition, LVDS emits less electromagnetic interference (EMI) than higher voltage single ended data transmission standards. Because CML is about twice the differential voltage of LVDS, CML is a higher EMI source than LVDS.

LVDS is generally used for point-to-point data transmission over backplane and cable media (the physical layer interfaces), while CML is more often used for point-to-point signaling between devices on a single board, and shorter backplane use. Applications for general purpose LVDS include central office, PBXs, switches, repeaters, and basestations, all of which are in the telecommunications field. In addition, LVDS is used in hubs, routers, and PECL/ECL to LVDS converters in data communications, and other applications such as digital cameras, printers and copiers.

While LVDS addresses the physical layer interface, CML is also rapidly becoming one of the most common standards for high speed point-to-point signaling between devices on a single board, and short backplane uses. Common applications for CML include all major digital systems, for example, ASIC's and DSP's.

Outside the TIA/EIA-644 standard lies multipoint LVDS. Multipoint LVDS supports backplane applications such as proprietary buses and small computer system interfaces or SCSI. SCSI is a high-performance peripheral interface that distributes data independently of the host computer. SCSI is used with devices such as hard disk drives, tape drives, CD-ROMs and scanners.

In addition to general-purpose point-to-point applications and multipoint applications, LVDS has been used for several years as an interface to flat panel displays. As a result, it is used extensively in notebook computers.

Physical layer interfaces are often a critical bottleneck in an application that requires high bandwidths, such as telecommunications and high speed networking. Using a differential signal reduces the system's susceptibility to noise and reduces EMI emissions, as well as delivering high speeds. Thus low voltage differential signaling results in a very cost-effective solution to some of the greatest bandwidth bottlenecks in many transmission applications.

As the need for faster communications and higher performance devices has grown, manufacturers have responded with new higher speed fiber optic technologies and applicable new optical transmission standards.

FIG. 2 shows some of the new Optical Carrier (OC) standards used to specify the speed of fiber optic networks conforming to the Synchronous Optical Network (SONET) standard for connecting fiber optic transmission systems. The table shows the speeds for common OC levels. For example, a high speed transceiver, conforming to OC-24, communicates at a minimum of 1.244 billion bits per second (Gbps).

FIG. 3 illustrates a standard metal cable communicating an analog signal, and a fiber optic cable communicating a digital signal. Fiber optic cables use glass or plastic threads (fibers) to transmit data. A fiber optic cable consists of a bundle of glass or plastic threads, each of which is capable of transmitting messages modulated onto light waves.

Fiber optic cables have several advantages over traditional metal communications lines: Fiber optic cables have a much greater bandwidth than metal cables, and can therefore carry more data. Fiber optic cables are less susceptible than metal cables to interference, are much thinner and lighter than metal wires, and data can be transmitted digitally rather than in an analog fashion.

Fiber optics and the new OC-X standards thus permit data transmission at much higher speeds, but still require the use of the physical layer interface devices such as transceivers and repeaters to receive, convert and transmit the data.

A conventional repeater circuit is illustrated in FIG. 4 and designated at reference numeral 200. The repeater circuit 200 receives a data transmission as a low voltage differential signal at, for example, 200 Mbps and 250 mV to 400 mV P—P signal swing centered at 1.2 Volts. This 1.2 Volt DC offset voltage for the differential signal is called the common mode voltage. This LVDS differential signal 205 is input to a receiver 210 which amplifies and converts the low voltage differential signal to TTL/CMOS single ended (binary) levels 215, which are more easily used by a predrive circuit 220. The predrive circuit 220 further amplifies, may convert to appropriate bias levels, or otherwise prepares the single ended signal 225, which is applied to the driver circuit 230. The driver circuit 230 contains low impedance drive transistors which again convert the data signal back into an LVDS differential signal, which is driven to the output terminals 235 across a resistive load, $R_{LOAD}$ 240. Thereby, a differential input voltage 205 is translated to a differential output voltage 235 and transmitted to a resistive load, $R_{LOAD}$ 240. This data transmission may travel over copper cables, printed circuit board traces or fiber optic cables.

One of the chief technical problems in producing a high speed repeater (e.g., up to 1.36 Gbps operation desired by many telecommunications customers) is meeting the extremely low rise/fall time and jitter requirements necessary for transmission of such fast signals. In most differential transceivers, there is at some point a translation from balanced differential to single ended logic and back to differential output levels. Because of the inherent difference in pull-up and pull-down speeds of differential to single ended translators, pulse skew (duty cycle modulation) and jitter are maximized at this point in the circuit. For this reason, and as discussed, the signal paths of high speed LVDS repeaters are fully balanced differential. Such repeaters are often implemented in Bipolar or BiCMOS processes, and employ all NPN output circuits. Though Bipolar circuits are fast, many DC biasing problems arise in the predrive and common mode correction schemes which are required to support these circuits.

FIG. 5 illustrates a previous generation LVDS driver circuit 245. The driver circuit 245 comprises a current loaded H-Bridge type circuit 250 that uses logic level input signals at $IN_1$ and $IN_2$ (e.g., 225 of FIG. 4) to control the direction of current in the load resistor $R_{LOAD}$ (e.g., 240 of FIG. 4). M1 and M3 are PMOS transistors, while M2 and M4 are NMOS transistors of the H-Bridge type circuit 250. In this configuration, the polarity of the $IN_1$ signal is opposite of $IN_2$, such that when $IN_1$ is high, the M2 and M3 transistors are on, and when $IN_1$ is low, the M1 and M4 transistors are on. This steers the drive output stage currents I1 (255) (e.g., about 3.5 mA) and I2 (260) (e.g., about 3.5 mA) through $R_{LOAD}$ to provide the differential output voltage. Note that in this configuration, half the transistors are on, and half are off at any time as they are used in a switch-mode fashion. Consequently, separate common mode control must be provided indirectly from the H-Bridge to an additional current control element (e.g., I1 (255)) via control line 290.

The common mode voltage of the differential output of FIG. 5 is controlled by the operational amplifier (opamp) A1 (265). The common mode is detected at node A 270 by the resistors R1 and R2 which are generally several orders of magnitude larger than $R_{LOAD}$, and is fed back to the inverting input of the opamp A1 (265). The common mode voltage 270 is compared with a reference voltage $V_{REF}$ (280), which in the case of TIA/EIA-644 compliant systems is set to 1.2 volts, and is generally created by a bandgap reference circuit 285. The output of the opamp A1 (290) is used to adjust the current I1 (255) to adjust the common mode of the output up or down. This conventional circuit has provided years of excellent results in LVDS systems, but can only achieve rise and fall times in the 400 ps range. For high speed repeater systems with transmission rates up to 1.36 Gbps, however, rise times of less than 220 ps under all conditions of temperature, supply voltage and process variation are required to conform to OC-24.

FIG. 6 illustrates a typical response 300 of the first generation LVDS driver circuit at 200 Mbps. FIG. 6 illustrates the differential output signals 310 and 320 (e.g., 235 of FIG. 4) which are seen on each side of $R_{LOAD}$ (e.g., 240 of FIG. 4), and a typical rise/fall time of about 400 ps. Note that the differential output signals 310 and 320 are centered about a common mode voltage of about 1.24 volts, have a signal swing of about 330 mV P—P, and a period of about 10 ns for a frequency of 100 MHz (200 Mbps). Thus, the conventional MOS driver circuit 245 of FIG. 5 is inadequate to provide the rise and fall times required for high speed (e.g., about 1.36 Gbps) data transmission to conform to OC-24.

FIG. 7 illustrates another prior art high speed repeater driver output stage 350 in an H-Bridge type circuit configuration. This circuit employs the high speed NPN devices which make high speed BiCMOS processes attractive to the RF designer. In this case, Q1 and Q2 are driven by a set of low voltage differential predrive signals IN1 and IN2. Q3 and Q4 are driven by a separate set of predrive signals IN3 and IN4. R3 and R4 drop the voltage to the output terminals Y and Z 360 to generally place the common mode voltage at the differential output in the vicinity of 1.2 volts, when operated at $I_{REF}$ 370. Although this circuit is exceedingly fast, providing rise times which easily meet the 220 ps requirements for 1.36 Gbps data transmission, there are several problems which must be overcome by the predrive stage (e.g., 220 of FIG. 4).

The first problem is in the biasing of the predrive signals. NPN devices must be biased in a very narrow range of input voltages in order to stay between the cutoff and saturation regions of operation. At the common mode output levels required by the TIA/EIA644 standard, the level required at IN1 and IN2 must fall in a range of a few hundred millivolts over all conditions of temperature and supply voltage. This type of control is difficult to achieve, and requires a great deal of care on the part of the designer.

The second problem is that of common mode control. The TIA/EIA644 standard calls for common mode output in the range from 1.125 V to 1.375 V. Since this is a fairly tight specification, some kind of control must be provided to assure this level, as in the circuit of FIG. 5. For the circuit of FIG. 7, the common mode control must be built into the predrive circuitry which provides the signals at IN1, IN2, IN3 and IN4. The topology of the driver output stage 350 is such that any control of the common mode is difficult at best, and probably will not meet the stringent requirements of the TIA/EIA644 standard.

FIG. 7A illustrates a prior art standard CML output driver 380, comprising a low-side differential pair with pull-up resistors and a common reference current source. The driver standard accepted by the industry for CML is basically an open collector (or open drain for MOS) differential pair to the output. Q1 and Q2 comprise the transistor differential pair of the CML driver output stage 380, with input signals coming from IN+, and IN−. The circuit is intended to switch current through R1 and R2 depending on the polarity of the inputs at IN+ and IN−.

The CML load is typically purely resistive, and is connected differentially to the supply. R1 & R2 are 50 ohm load resistors that are commonly implemented external to the differential pair. This topology, in addition to being extremely simple and quite fast, also has the advantage of terminating the output media to exactly 50 ohms. Termination in this manner minimizes distortion due to signal reflection. When the reference current (tail current) $I_{REF}$ 390 is set to 15 mA, the output differential voltage between OUT+ and OUT− is:

$$V_{OUT}=15\ mA * 50\ ohms = 750\ mV.$$

Generally, the output protocol is intended to be a differential output that switches somewhere between 700 mV and 800 mV with a fairly high common mode output voltage $V_{CM}$ of:

$$V_{CM}=V_{CC}-750\ mV/2,$$

$$V_{CM}=V_{CC}-375\ mV.$$

Outputs of this type are generally not tri-stateable, and there is no standard for short circuit protection or leakage current, etc.

Accordingly, there is a need for a single high bandwidth driver circuit which is able to drive a standard CML load with a CML compatible signal, and a standard LVDS load with an LVDS differential signal conforming to the new OC-24 and TIA/EIA-644 standards, and wherein the driver operates at up to 1.36 Gbps with less than 220 ps rise/fall times, demonstrates a high jitter tolerance with excellent common mode control even at high current loading, while maintaining a simple pre-drive circuit design with a wide common mode range.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later.

The invention is directed to a single circuit that is capable of interchangeably driving both LVDS and CML signal levels. The high bandwidth driver circuit is used for data transmission in LVDS transceiver device applications (e.g., LVDS repeaters and PECL/ECL to LVDS converters), and CML transceiver device applications (e.g., on PCB transmitters and receivers). The lLVDS transceivers are intended to receive a low voltage differential input signal and drive a TIA/EIA-644 compliant LVDS signal to a standard LVDS load. The CML transceivers are intended to receive a low voltage differential input signal and drive a data transmission signal compatible with current mode logic (CML) levels and transmission standards to a standard CML load.

As the LVDS output of the present invention is compliant with the TIA/EIA-644 standard, many long distance friendly features are included such as a tight differential mode, a common mode output standard, low output common mode noise at high speeds, and rise/fall time restrictions.

Additionally, the present invention is compliant with the CML standard using a very simple receiver which in some cases is not capable of receiving signals over a wide common mode range typically introduced by the ground offsets in a cable environment. CML has a particular advantage in offering simple transceivers that can be designed with CMOS.

Thus, a driver circuit is provided to a circuit designer who is working in a system which requires both LVDS and CML levels, in a single interface component qualified for both types of transmission signaling.

According to another aspect of the present invention, the driver output may be routed through circuitry (e.g., passgates, relays, mux.) to an LVDS bus or a CML bus.

The driver circuit operates at high speeds (e.g., up to 1.36 Gbps), making it compatible with the OC-24 signaling rate for optical transmission and very desirable for communications applications. To accomplish this, the driver uses a mixed combination of voltage and current mode drive sections in a driver output circuit. MOS transistors and a current source are used in a current mode switch portion to switch the drive with a constant current at high speeds, and bipolar (e.g., NPN) transistors in a voltage mode output portion provide variable impedance for the driver output circuit. A common mode compensation circuit using a feedback voltage from the load generates a compensation signal for variable impedance control of the NPN transistors to yield a regulated common mode DC voltage.

Thus the innovative driver circuit uses a unique combination of drive components in a high speed BiCMOS process to achieve a device with excellent common mode control even at high current loading, while maintaining a simple pre-drive circuit design with a wide common mode range.

In accordance with the present invention, a driver circuit for high speed data/communications transmission is disclosed. The driver circuit combines two driver stage transistors with a common mode control circuit to create low impedance differential voltage regulators for the common mode voltage produced at the driver output terminals which are across the load.

In one exemplary aspect of the invention, a common mode compensation circuit monitors a common mode voltage associated with the load, and compares it to a reference voltage to generate a compensation signal which is coupled to a first output drive portion of the output circuit. The first output drive portion is coupled to the supply voltage, and in response to the compensation signal produces a variable impedance that regulates the common mode voltage associated with the load to a voltage generally equal to a reference voltage. A second output drive portion of the output circuit is also coupled to the first output drive portion, the load, a current source, and a low voltage differential input. The low voltage differential inputs to the second output drive portion switch alternate polarity terminals of the load to the current source and to the regulated common mode voltage. Thus, a feature of the present invention is that the need for a separate adjustable current source is avoided.

An exemplary feature of the circuit of this invention, therefore, provides an improved topology for drivers specifically geared for high speed repeater applications. The circuit provides a significant improvement in rise times, enabling 1.36 Gbps operation that is desired by many telecommunications customers, and greatly simplifies the DC biasing requirements for the predrive circuit. Additionally, the circuit provides a substantial increase in the common mode compliance of the driver. The methodology and architecture used to achieve these goals provide a significant improvement in performance over the prior art.

In another aspect of the present invention, the driver circuit uses a mixed voltage mode and current mode driver output circuit. More particularly, the present invention may also be represented as a voltage mode output circuit which works together with a common mode compensation circuit to operate as low impedance voltage regulators to maintain the common mode voltage at the level set by a voltage reference. Further, the present invention has a current mode switch circuit containing the main switching elements, which works together with a low voltage differential input signal and a current source to generate the LVDS differential output signal that is transmitted to the load.

Thus, the output circuit of the LVDS driver circuit of the present invention is represented as a voltage mode output circuit (e.g., first output drive portion), and a current mode switch circuit (e.g., second output drive portion), which together form the driver output circuit (e.g., driver output stage) of the driver circuit. Finally, the driver output circuit combined with the compensation circuit, the current source, and the power supply rails, complete the present invention driver circuit. Technically, the load resistor is in the receiver section of an external receiving device, so was not included here with the driver circuit. The load resistor is only shown to illustrate how the driver circuit current is completed.

An advantage of the present invention is that the use of a smaller (e.g., 1V P—P) input voltage from the predrive circuit, allows faster operation of the switching transistors of the current mode switch circuit. The lower input voltage swing means that not as much charge current must be dumped in and out of the gate oxide region as with prior art MOS drives, therefore the voltage is allowed swing more quickly.

Another related advantage of the present invention comes through using MOS transistors as drive elements for the simplification of the predrive stage. Since MOS transistors have a much larger range of DC input voltages over which they are able to work effectively, the predrive circuit is not required to maintain an extremely tight common mode range.

Still another advantage of the present invention, is in the use of bipolar (e.g., NPN) transistors in the voltage mode output circuit (e.g., first output drive portion), which allows a simple voltage follower design configuration in combination with the compensation circuit, while providing a very high current gain for the voltage regulation of the common mode voltage.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 1 is a timing diagram that illustrates typical voltage swings for some of the various transmission standards;

FIG. 2 is a table that illustrates some of the new Optical Carrier (OC) standards used to specify the speed of fiber optic networks conforming to the Synchronous Optical Network, (SONET) standard for connecting fiber optic transmission systems;

FIG. 3 is a perspective view that illustrates a standard metal cable communicating an analog signal, and a fiber optic cable communicating a digital signal;

DETAILED DESCRIPTION OF THE INVENTION

Figure 4:
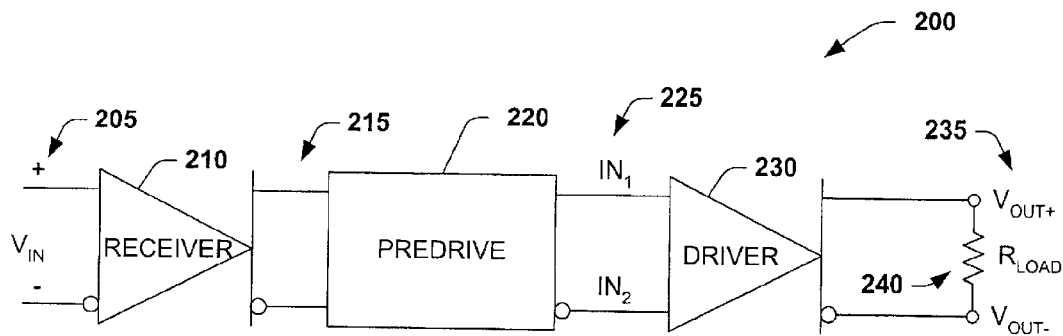
FIG. 4 is a block diagram of a conventional repeater circuit used to receive a differential input signal and translate it to a differential output signal across a resistive load $R_{LOAD}$.

The present invention will now be described with reference to the drawings, wherein like reference numerals are used to refer to like elements throughout. The present invention relates to a high speed driver circuit used in the field of telecommunications, and for data communications transmission in LVDS transceiver device applications (e.g., LVDS repeaters and PECL/ECL to LVDS converters), and CML transceiver device applications (e.g., on PCB transmitters and receivers). The transceivers are intended to receive a low voltage differential input signal and interchangeably drive a standard LVDS load with a TIA/EIA-644 compliant LVDS signal, or a standard CML load with a standard CML compatible signal. The driver circuit operates at speeds up to 1.36 Gbps, making it compatible with the OC-24 signaling rate for optical transmission.

The high speed driver circuit employs the use of a mixed voltage mode and a current mode drive section in the output circuit when coupled to LVDS loads, and when the driver is coupled to CML loads, operates purely in a current mode using only the current mode drive section.

The present invention comprises a first output drive portion which functions as a voltage mode output circuit, which is coupled together with a common mode compensation circuit to provide low impedance voltage regulators to maintain the common mode voltage across a load, at a level set by a voltage reference. The invention further comprises a second output drive portion functioning as a current mode switch circuit containing the main switching elements, which is operably coupled to receive a low voltage differential input signal and a current source, and is operable to generate the LVDS differential output signal that is transmitted to the load.

Figure 8:
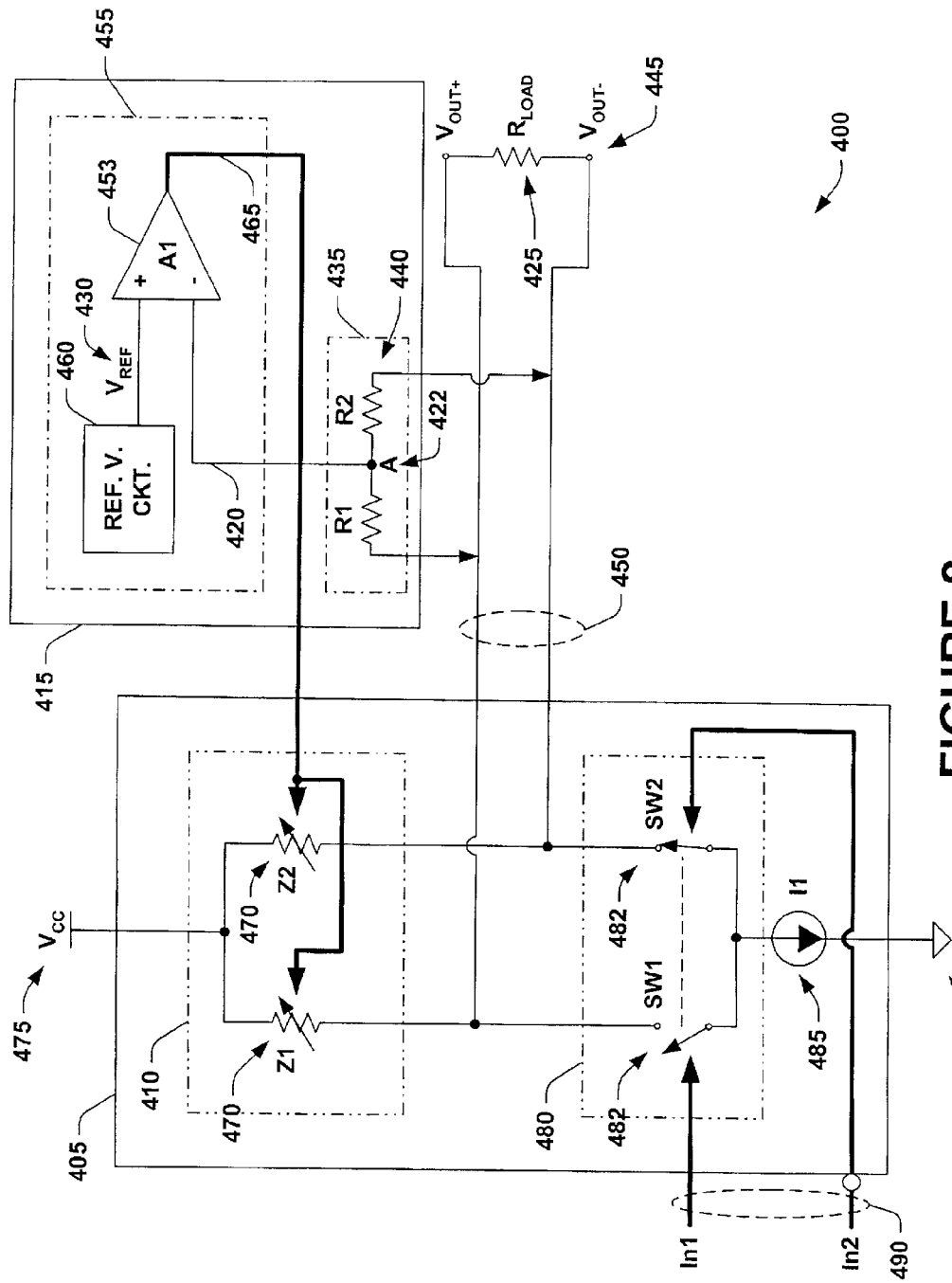
FIG. 8 is a simplified block diagram of an exemplary high speed driver circuit with a standard LVDS load configuration in which various aspects of the present invention may be carried out.

FIG. 8 illustrates a simplified functional diagram of an exemplary high speed driver circuit 400 according to the present invention. The driver circuit 400 comprises an output circuit 405 comprising a first output drive portion 410 which functions as a voltage mode output circuit which is coupled together with a common mode compensation circuit 415 to provide low impedance voltage regulation that maintains a common mode voltage 420 associated with a load resistor $R_{LOAD}$ 425, at a level set by a voltage reference 430.

Although an exemplary standard LVDS load configuration 425 is illustrated in FIG. 8, the same high speed driver circuit 400 will also be illustrated and described as used in the CML load configuration application shown later in FIG. 9a. The standard LVDS load configuration is instructive to begin with, as the entire circuit is used in this application. Later, when the standard CML load configuration is described, the circuitry associated with the common mode regulation will simply be unused.

Returning to FIG. 8, the common mode compensation circuit 415 contains a common mode monitor circuit 435 comprising a voltage divider 440 (e.g., two resistors), which monitors the common mode voltage 420 as seen at a node "A" 422 associated with the load resistor $R_{LOAD}$ 425. The common mode voltage 420 is a DC voltage produced by the voltage divider 440 midway between the output terminals $V_{OUT+}$ and $V_{OUT-}$ 445, about which the high speed LVDS differential signal 450 swings. The common mode voltage 420 is coupled to an inverting input of an opamp A1 (453) used in a common mode error amplifier circuit 455. The opamp A1 (453) compares the common mode voltage 420 to a reference voltage 430 produced by a reference voltage circuit 460 to generate a compensation signal 465.

The compensation signal 465 (illustrated as a heavy line in FIG. 8 to symbolize a functional control) is coupled to two variable impedances Z1 and Z2 (470), within the first output drive portion 410 of the driver output circuit 405. The two variable impedances Z1 and Z2 (470) are coupled together (e.g., at the supply voltage 475) and to the output terminals $V_{OUT+}$ and $V_{OUT-}$ 445 which are across the load resistor $R_{LOAD}$ 425, and to a second output drive portion 480 of the output circuit 405. In response to the compensation signal 465, the two variable impedances Z1 and Z2 (470) are varied in magnitude to compensate the common mode voltage 420 associated with the load 425 to a voltage approximately equal to the reference voltage 430. Thus, the need for a separate adjustable current source as utilized in the prior art is avoided.

The second output drive portion 480 functions as a current mode switch circuit of the output circuit 405. The second output drive portion 480 has two switching transistors 482 coupled together and to a first terminal of a current source 485. The current source 485 has a second terminal which is coupled to a predetermined potential (e.g., ground 495). The second output drive portion 480 is also coupled to the first output drive portion 410, and to the output terminals $V_{OUT+}$ and $V_{OUT-}$ 445 which are across the load resistor $R_{LOAD}$ 425. Lastly, the second output drive portion 480 is coupled to a low voltage differential input signal 490 (illustrated as two heavy lines in FIG. 8 to symbolize differential functional control) from inputs In1 and In2. The low voltage differential input signal 490 (e.g., about 1V P—P) alternately steers the output circuit current between one input of the load resistor 425 and the other, thereby providing the differential output voltage (at output terminals $V_{OUT+}$ and $V_{OUT-}$ 445).

It will be appreciated that in one exemplary aspect of the present invention, FIG. 8 functionally illustrates switches SW1 and SW2 as the switching transistors 482, and as such may, but need not fully switch off. In the exemplary simplified functional diagram, the switching transistors 482 have an on-state current and an off-state current, wherein the on-state current is higher than the off-state current (e.g., about 8.75 mA on-state, and about 5.25 mA off-state current), but the off-state current may include zero mA in another implementation.

Thus, the present invention provides a high speed driver circuit in LVDS and CML transceiver device applications for producing a high speed differential signal for transmission to a load conforming to OC-24 and TIA/EIA-644 standards with a high jitter tolerance and excellent common mode control.

Further, an exemplary aspect of the present invention provides a circuit which integrates a drive portion (e.g., 410) of the output circuit, directly into the common mode control function. By contrast, conventional LVDS drive circuits externally control the common mode voltage separately from the output circuit drive transistors to a higher impedance internal node. This permits an order of magnitude improvement of the common mode control.

Figure 9:
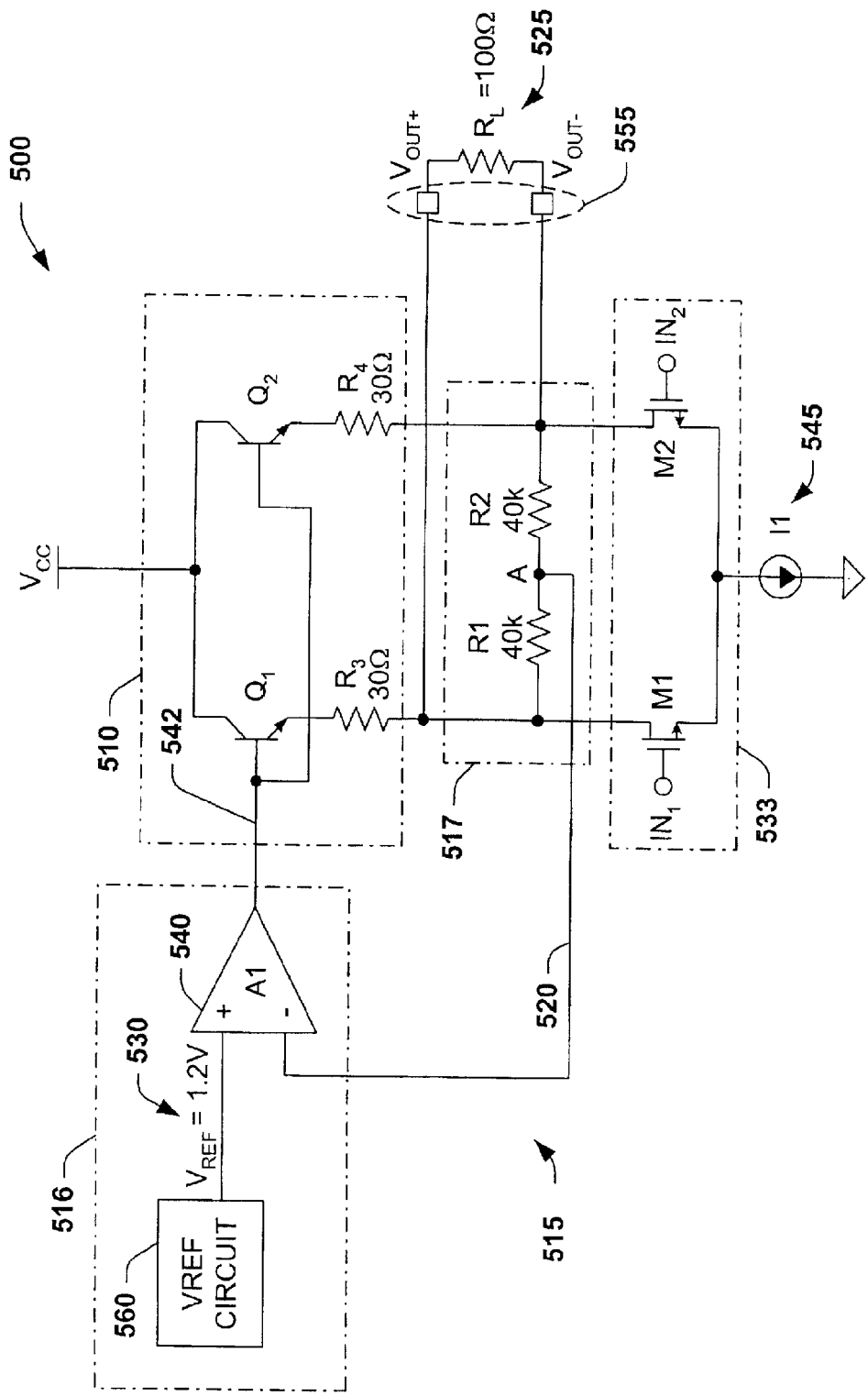
FIG. 9 is a simplified schematic diagram of an exemplary high speed driver circuit used with a standard LVDS load configuration in which various aspects of the present invention may be carried out.

FIG. 9 is a simplified schematic diagram of an exemplary high speed driver circuit 500 with a standard LVDS load configuration in accordance with various aspects of the present invention. The driver circuit 500 comprises a first output drive portion 510 which functions as a voltage mode output circuit which is coupled together with a common mode compensation circuit 515, comprising a common mode error amplifier circuit 516 and a common mode voltage monitor circuit 517, to provide low impedance voltage regulation that maintains the common mode voltage 520 associated with the load resistor $R_L$ 525, at a level set by a voltage reference $V_{REF}$ (e.g., about 1.2V) 530.

Here again, the present invention provides a circuit which integrates a low impedance control portion (e.g., 510) of the driver output circuit directly into the common mode control function, providing an extremely well controlled common mode output. By contrast, conventional LVDS drive circuits externally control the common mode voltage with a high impedance node separately from the output drive transistors.

The driver circuit 500 also comprises a second output drive portion 533 which functions as a current mode switch circuit of the output drive transistors M1 and M2 to switch at the necessary speeds.

In the driver circuit 500 of FIG. 9, the NMOS devices M1 and M2 of the second output drive portion 533 are the main switching elements, with Q1 and Q2 providing common mode control. The common mode is detected by the voltage divider 517 resistors R1 and R2, and is fed back from node "A" to the inverting node of opamp A1 (540), resulting in a compensation signal 542 to the bases of Q1 and Q2. Q1 and Q2 of FIG. 9 therefore operate as low impedance voltage regulators to maintain the common mode voltage 520 at the level set by $V_{REF}$ 530. A current source I1 (545) provides the current (e.g., about 14 mA) through $R_L$ 525 plus whatever current is needed to drive the low side. For example, if M2 is on and M1 is off, then the signal current flows from Q1 through R3, into the load $R_L$ 525, and through M2. This provides the differential voltage across $R_L$ 525 and the high speed LVDS differential signal 555. In this case, the voltage across $R_L$ 525 is positive as shown in FIG. 9, and the voltage at the drain of M2 is lower than the voltage at the drain of M1. Since this is the case, the emitter voltage of Q2 is lower than the emitter voltage of Q1, and thus the base—emitter voltage is higher. The collector current in a bipolar transistor is exponentially related to the base—emitter voltage by the formula:

$$I_C = I_S \cdot A \cdot e^{(Vbe/Vt)}$$

This means that the NPN transistor supplying the low side current must supply much more current than the load current. The effect is that the circuit burns a great deal of "Class A" current, but runs very fast. The advantage of using MOS transistors M1 and M2 as the drive elements is in the simplification of the predrive stage which drives inputs $IN_1$ and $IN_2$. Since MOS transistors have a much larger range of DC input voltages over which they are able to work effectively, the predrive circuit is not required to maintain an extremely tight common mode range.

According to one aspect of the present invention, the reference voltage $V_{REF}$ 530 of FIG. 9 may be supplied by a reference voltage circuit 560 (e.g., a bandgap circuit) which is external or internal to the common mode error amplifier circuit 516.

Figure 9A:
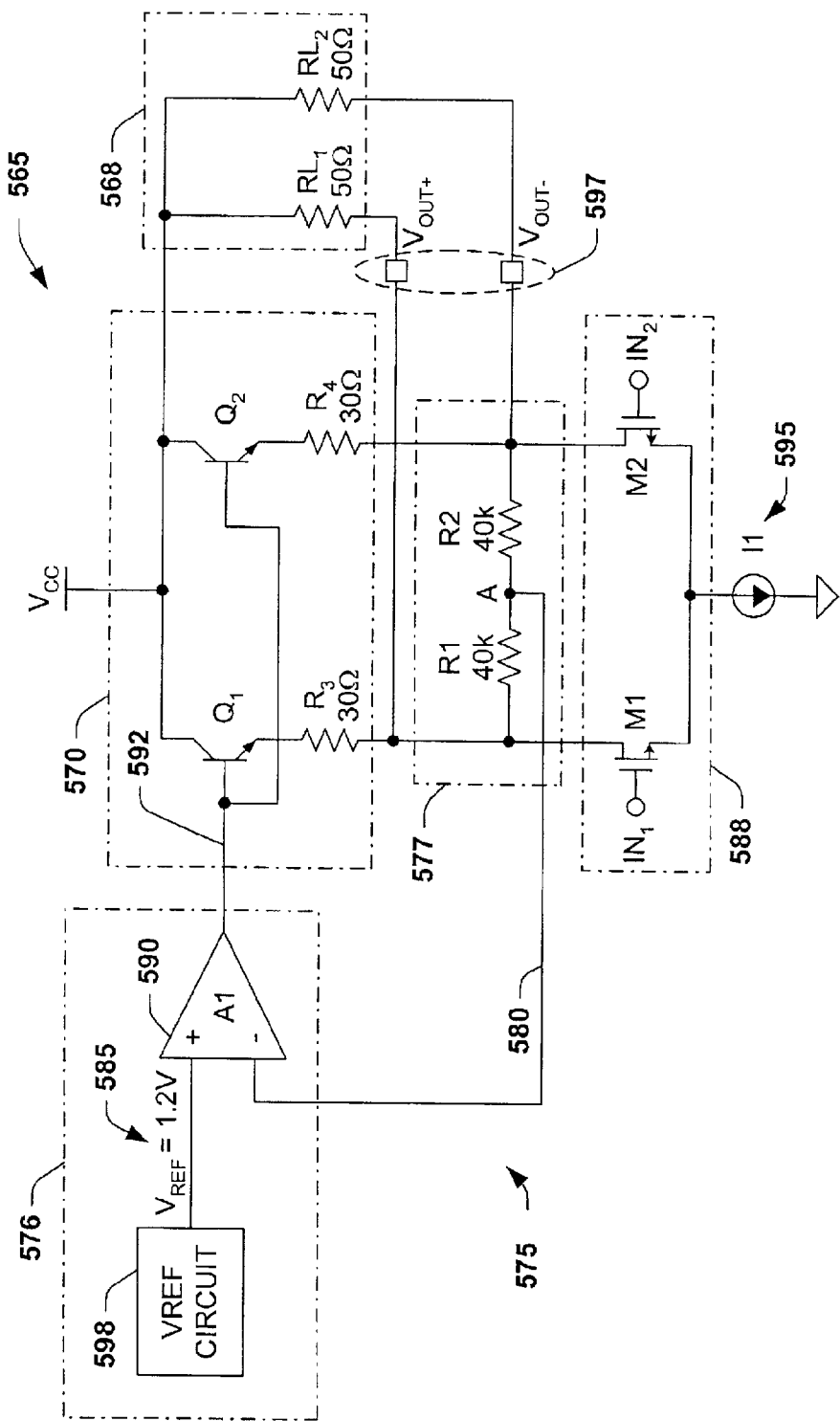
FIG. 9A is a simplified schematic diagram of an exemplary high speed driver circuit used with a standard CML load configuration in which various aspects of the present invention may be carried out.

FIG. 9A is a simplified schematic diagram of an exemplary high speed driver circuit 565 similar to FIG. 9, but here used for driving a standard CML load with a CML compatible signal in accordance with various aspects of the present invention. The driver circuit 565 comprises all the same identical components and functions as previously described in FIG. 9, except for the connection to a standard CML output load 568 comprised of RL1 & RL2 50 ohm load resistors.

As previously described, the CML loadin the present example is purely resistive, and is connected differentially to the supply voltage. RL1 & RL2 are 50 ohm load resistors, which are commonly implemented external to the differential pair. This topology, in addition to being extremely simple and quite fast, also has the advantage of terminating the output media to 50 ohms. When used with a well-designed transmission media, back termination in this manner minimizes distortion due to signal reflection.

In this case, the driver circuit 565 operates entirely as a current mode differential output. Since RL1 and RL2 connect directly to the supply rail, the first output drive portion 570 which is coupled together with a common mode compensation circuit 575, comprising a common mode error amplifier circuit 576 and a common mode voltage monitor circuit 577, are biased off, and are therefore unused in the CML driver mode.

To explain this more fully: with the emitters of Q1 and Q2 pulled up by the external load resistor circuit 568, the voltage regulator circuit does not contribute any current to the operation of the circuit, and everything above the M1/M2 differential pair can be safely ignored in the CML current mode, with the load for M1/M2 being provided entirely by RL1 and RL2. In this mode, the circuit resembles the topology presented in FIG. 7a.

Since Q1 and Q2 are no longer providing voltage regulation to adjust the common mode of the output, the common mode is set entirely by the supply voltage and the value of the current in I1 (595). Thus, the CML output is made to operate totally current mode, by contrast to the LVDS mixed voltage/current mode output, which uses the purely differential single resistive load (525 of FIG. 9). If I1 (595) is set to 15 mA similar to that discussed with FIG. 9 at 14 mA, the circuit is compatible with standard CML outputs producing a differential voltage of 750 mV. In this way, the driver circuit according to an aspect of the invention is able to be used as either an LVDS driver or a CML driver depending on the connection of the external resistive load.

Here again, the driver circuit 565 also comprises a second output drive portion 588 which functions as a current mode switch circuit of the output drive transistors M1 and M2 to switch at the necessary speeds.

In the CML driver circuit 565 of FIG. 9a, the NMOS transistors (differential pair) M1 and M2 of the second output drive portion 588 are the main switching elements, which together with I1 595 result in the primary components used in the CML current mode. The differential pair in this example may be either NMOS or NPN devices. No common mode voltage need be supplied or regulated in the CML current mode, thus the entire common mode compensation circuit 575 is unused.

Figure 10:
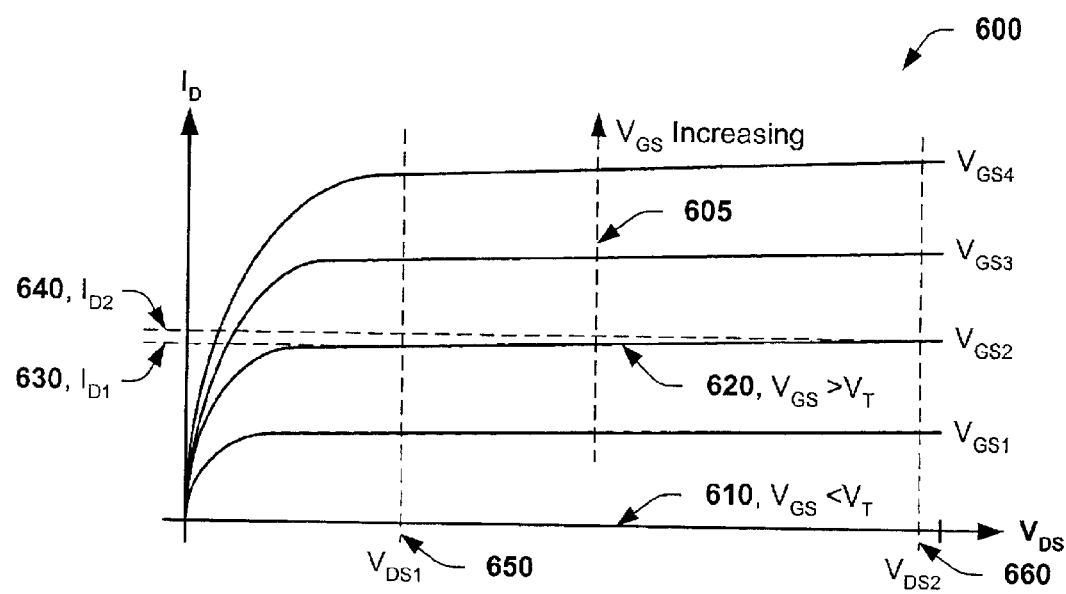
FIG. 10 is a current/voltage diagram that illustrates an $I_D$ vs. $V_{DS}$ plot of a family of $V_{GS}$ curves for a MOS device, demonstrating how a slight change in drain current can cause a large drain to source voltage change as, used in adjusting the common mode voltage in accordance with an aspect of the invention.

FIG. 10 illustrates an $I_D$ vs. $V_{DS}$ plot for a family of $V_{GS}$ curves 600 for a MOS device, demonstrating how a slight change in drain current can cause a large drain to source voltage change as used in adjusting the common mode voltage in accordance with an aspect of the invention and the LVDS/CML driver circuit of FIG. 9. In the family of $V_{GS}$ curves 600, increasing gate to source voltage 605 curves are shown ranging from $V_{GS} < V_T$ 610, where $I_D = 0$, to $V_{GS} > V_T$ 620 (e.g., $V_{GS1}$, $V_{GS2}$, $V_{GS3}$, and $V_{GS4}$), where $I_D > 0$.

The effect works like this; when a slight compensation is made to Q1 and Q2 for a correction of the common mode voltage (thereby altering their impedance, respectively), an exponential change in current results in each emitter circuit, as discussed above. As the Q1/Q2 emitters are coupled thru the MOS transistors M1 and M2, respectively, this emitter current change produces a drain current change, for example, from $I_{D1}$ (630) to $I_{D2}$ (640) of FIG. 10. The drain current change then, results in a dramatically larger drain to source voltage change, for example, from $V_{DS1}$ (650) to $V_{DS2}$ (660), since M1 and M2 have a fixed range of input gate voltage applied at $IN_1$ and $IN_2$ (e.g., about 1V P—P). Therefore, a slight compensation signal 542 voltage change results in an exponential emitter current and drain current change, which yields a dramatically larger drain to source voltage change in M1 and M2 to correct the common mode voltage 520. This permits an order of magnitude improvement of the common mode control over previous designs.

Figure 5:
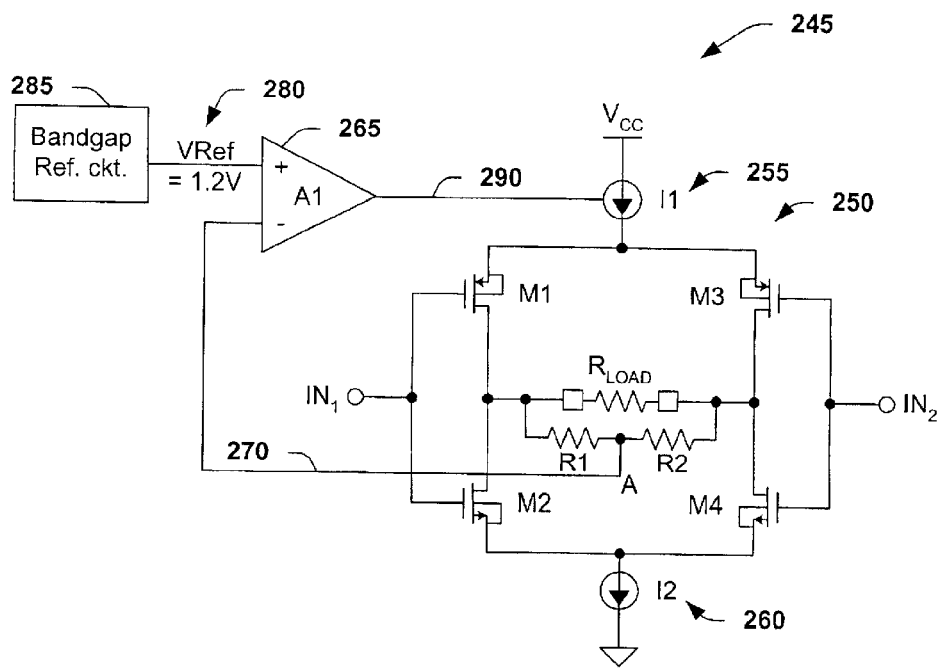
FIG. 5 is a schematic diagram that illustrates a previous generation LVDS driver circuit.
Figure 11:
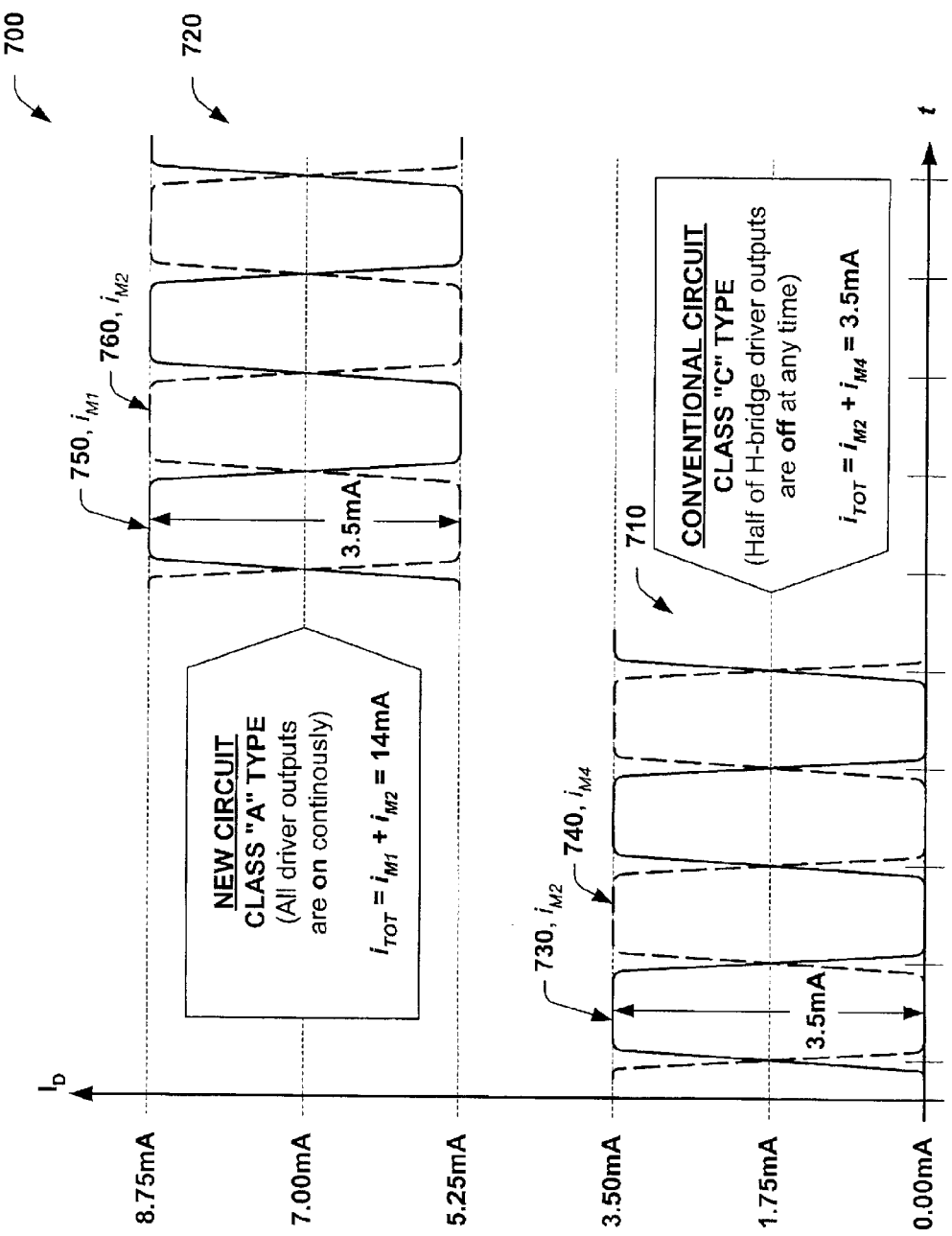
FIG. 11 is a timing diagram that illustrates two waveform comparison cases of the LVDS differential output signals for comparing a prior art class "C" waveform to a class "A" waveform in accordance with an aspect of the present invention.

FIG. 11 illustrates a waveform comparison 700 between LVDS differential output signals of a prior art class "C" waveform 710 and a class "A" waveform 720 in accordance with an aspect of the present invention. In the waveform 710 of the conventional circuit, a high at $IN_1$ and a low at $IN_2$, causes conduction of drive transistors M2/M3 (of FIG. 5) producing a drain current iM2 (730 of FIG. 11), and a high at $IN_2$ and a low at $IN_1$, causes conduction of drive transistors M4/M1 (of FIG. 5) producing a drain current $i_{m4}$ (740 of FIG. 11). These differential drain currents, which flow thru the driver output circuit, are generally the same differential output signals which flow thru the load resistance ($R_{LOAD}$ of FIG. 5). In the waveform case 710, the load resistor ($R_{LOAD}$ of FIG. 5), receives the full drain current flowing in the output circuit. In other words, half of the output circuit driver transistors are off, and half are on at any time. Thus, the waveform 710 of FIG. 11 is considered a Class "C" circuit, passing substantially all the current source (12 of FIG. 5) current thru the load resistor.

The current source requires:

|  | $i_{TOT} = i_{M2} = 3.5$ mA |
| --- | --- |
| When M2 & M3 = "off"; | $i_{TOT} = 0 + 3.5$ mA = 3.5 mA |
| When M1 & M4 = "off"; | $i_{TOT} = 3.5$ mA + 0 = 3.5 mA |

In the waveform 720 of the LVDS driver circuit according to one exemplary aspect of the present invention, a high at $IN_1$ and a low at $IN_2$, causes conduction of the drive transistor M1 (of FIG. 9) producing a drain current $i_{M1}$ (750 of FIG. 11), and a high at $IN_2$ and a low at $IN_1$, causes conduction of the drive transistor M2 (of FIG. 9) producing a drain current $i_{M2}$ (760 of FIG. 11). These differential drain currents which flow thru the driver output circuit of the present invention, are set to keep all of the output drive transistors on to some extent at all times. In the waveform case 720, only the differential output circuit drain currents form the differential output signals 555 which flow thru the load resistance ($R_{LOAD}$ 525 of FIG. 9), and not the full drain current flowing in the output circuit. In other words, all of the output circuit driver transistors are on to some extent at any time, and therefore run hot, but run fast. Thus, the waveform 720 of FIG. 11, illustrates a Class "A" circuit, passing only the differential driver current thru the load resistor. The current source requires:

|  | $i_{TOT} = i_{M1} + i_{M2} = 14$ mA |
| --- | --- |
| When M1 = "off"; | $i_{TOT} = 5.25$ mA + 8.75 mA = 14 mA |
| When M2 = "off"; | $i_{TOT} = 8.75$ mA + 5.25 mA = 14 mA |

The differential load current at $R_{LOAD}$ is:

|  | $i_{RLOAD} = i_{M1} - i_{M2} = 3.5$ mA |
| --- | --- |
| When M1 = "on", & M2 = "off"; | $i_{RLOAD} = 8.75$ mA − 5.25 mA = 3.5 mA |
| When M1 = "off", & M2 = "on"; | $i_{RLOAD} = 5.25$ mA − 8.75 mA = −3.5 mA |

Therefore, M1 and M2 operate as the main switching elements of the output drive stage in the present invention, but function with only a low voltage differential input from the predrive (e.g., about 1V P—P), while working around their threshold voltage $V_T$. Thereby, the MOS switching transistors M1 and M2, do not need to dump as much charge from the gate oxide region, permitting a higher slew rate of the input voltage and much faster operation than conventional MOS LVDS drive circuits. The following equation demonstrates this relational effect between a lower (gate) charge current and a lower input voltage requirement (for producing a higher slew rate gate voltage):

$$V = 1/c \cdot \int i$$

Figure 11A:
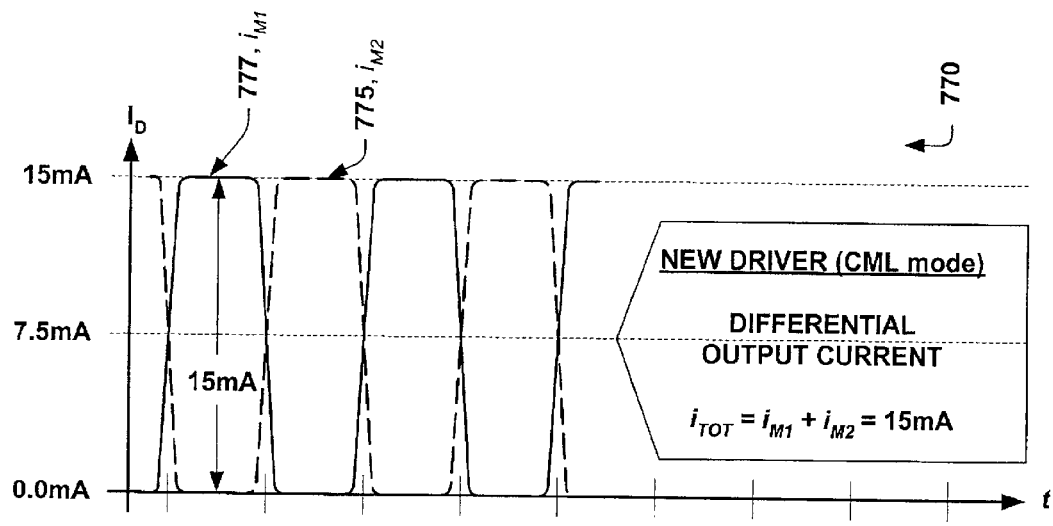
FIG. 11A is a timing diagram of the differential output current waveforms of an exemplary high speed driver circuit similar to FIG. 9a, for driving standard CML compatible logic levels in accordance with an aspect of the present invention.
Figure 11B:
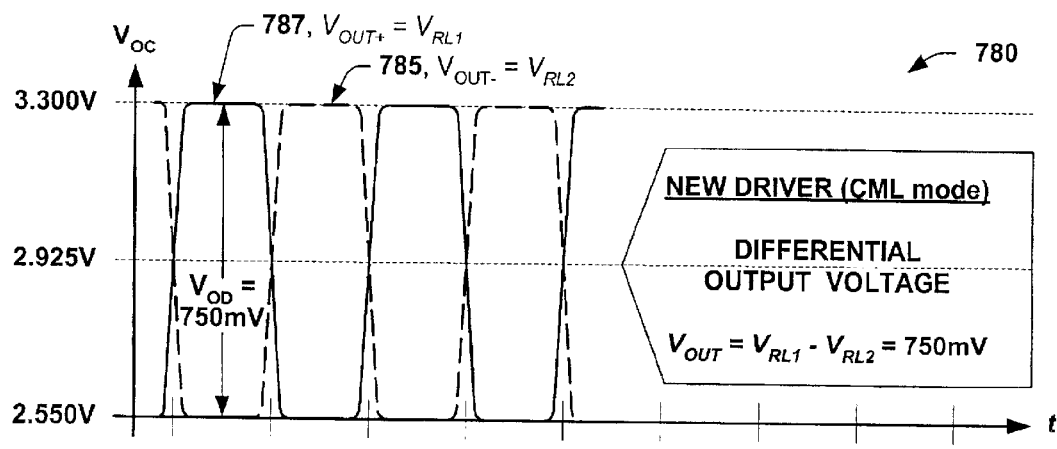
FIG. 11B is a timing diagram of the differential output voltage waveforms of an exemplary high speed driver circuit similar to FIG. 9a, for driving standard CML compatible logic levels in accordance with an aspect of the present invention.

In the same way that FIG. 11 illustrates the current into a standard LVDS load, FIGS. 11A and 11B illustrate the current and voltage produced by the driver circuit into a standard CML load.

FIG. 11A illustrates a waveform 770 of the differential output current signals of an exemplary CML load application of the driver of FIG. 9A. Unlike the standard LVDS loading application of the driver as shown in FIG. 9, which produces a class "A" conduction in the output drive section, the standard CML load produces a class "C" conduction in accordance with an aspect of the present invention. In the waveform 770 of the present invention, when a low voltage differential signal is applied to the driver, producing a high at $IN_1$ and a low at $IN_2$ (588 of FIG. 9A), conduction of drive transistor M1 produces a drain current $i_{M1}$ (777 of FIG. 11A), and drive transistor M2 is turned off. Then, when the applied signal produces a high at $IN_2$ and a low at $IN_1$, conduction of drive transistor M2 produces a drain current $i_{M2}$ (775 of FIG. 11A), and drive transistor M1 is turned off. Thus, only one drive transistor (M1 or M2) is ON at a time, conducting to one of the load resistors (M1 to RL1, or M2 to RL2) the tail current I1 (595 of FIG. 9a) which is set at about 15 mA for both standard CML and standard LVDS loads. In the case of the CML load, the total current is also the differential current, which is 15 mA. Or:

|  | $i_{TOT} = i_{M1} + i_{M2} = 15$ mA |
| --- | --- |
| When M1 = ON & M2 = OFF; | $i_{TOT} = 15$ mA + 0 = 15 mA |
| When M1 = OFF & M2 = ON; | $i_{TOT} = 0 + 15$ mA = 15 mA |

The total differential load resistance $R_{TOT}$ is:

$R_{TOT} = RL_1 + RL_2$ $R_{TOT} = 50$ ohms + 50 ohms $R_{TOT} = 100$ ohms

As illustrated by the output voltage waveforms 780 of FIG. 11B, the 15 mA drain current (either in $i_{M1}$ or $i_{M2}$), flowing thru the driver output circuit and thru the 50 ohm load resistors (RL1, or RL2 of FIG. 9a), produces a voltage drop of 750 mV across each load resistor. Again, only one output drive transistor is ON at any time, therefore, $V_{OUT}$ (597 of FIG. 9A) is pulled-up to $V_{CC}$ by one of the load resistors (568 of FIG. 9A) when the corresponding driver transistor is not conducting, or is at a voltage of 750 mV less than $V_{CC}$ when the corresponding driver transistor is conducting. In the case of the CML load, the total of the voltage drops across both load resistors is also the differential voltage $V_{OUT}$, which is 750 mV. The output differential voltage $V_{OD}$ is:

Given: $V_{CC}$ = 3.3 V, and $V_{RL1}$ = I*R = 15 mA * 50 ohms = 750 mV
When M1 or M2 is "ON":  $V_{OUT} = V_{CC} - V_{RL} = 3.3$ V – 750 mV = 2.55 V
When M1 or M2 is "OFF":  $V_{OUT} = V_{CC} - V_{RL} = 3.3$ V – 0 V = 3.3 V
  $V_{OD} = V_{OUT} = V_{OUT+} - V_{OUT-} = 750$ mV
And:  $V_{OD} = V_{RL1} - V_{RL2} = 750$ mV
When M1 = ON & M2 = OFF;  $V_{OD} = 2.55$ V – 3.3 V = –750 mV
When M1 = OFF & M2 = ON;  $V_{OD} = 3.3$ V – 2.55 V = 750 mV In the output voltage waveforms 780, the 50 ohm load resistor (RL1 of FIG. 9A) of the driver circuit according to one exemplary aspect of the present invention, a high at $IN_2$ and a low at $IN_1$, causes conduction of the drive transistor M2 (of FIG. 9A) producing a drain current $i_{M2}$ and an output voltage $V_{OUT-}$ (785 of FIG. 11B) which is the voltage drop $V_{RL2}$ across the load resistor RL2. A high at $IN_1$ and a low at $IN_2$, causes conduction of the drive transistor M1 (of FIG. 9A) producing a drain current $i_{M1}$ and an output voltage $V_{OUT+}$ (787 of FIG. 11B) which is the voltage drop $V_{RL1}$ across the load resistor RL1.

As with the standard LVDS load, the standard CML load configuration uses the same average current flows through the output drive stage. Operating with these currents, M1 and M2 remain the main switching elements of the output drive stage, and therefore run relatively hot, but also run fast, controlled with only a low voltage differential input from the predrive (e.g., about 1V P—P), while working around their threshold voltage $V_T$.

Figure 6:
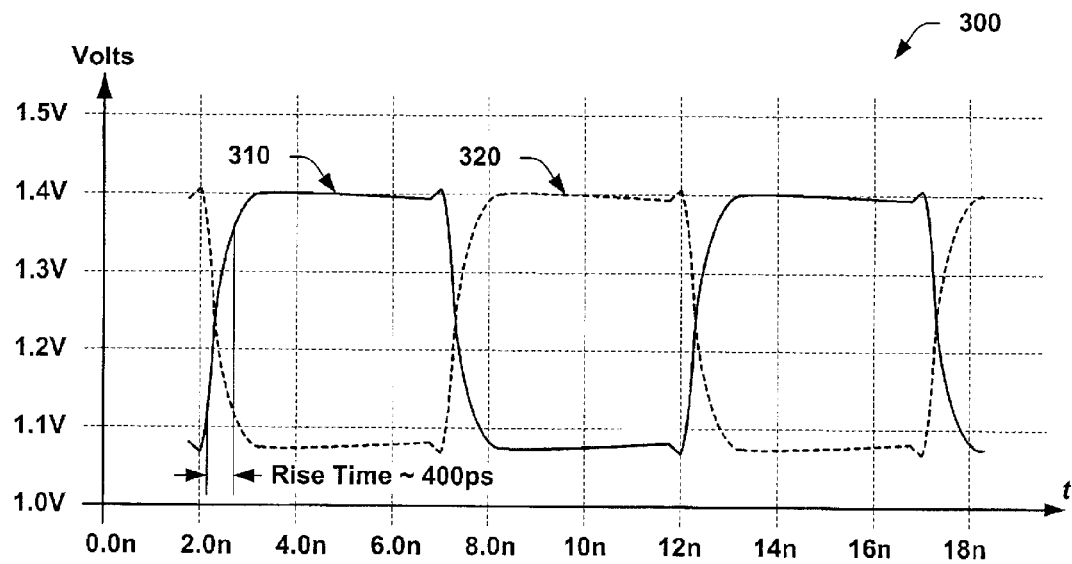
FIG. 6 is a timing diagram that illustrates the typical response of the first generation LVDS driver circuit at 200 Mbps.
Figure 12:
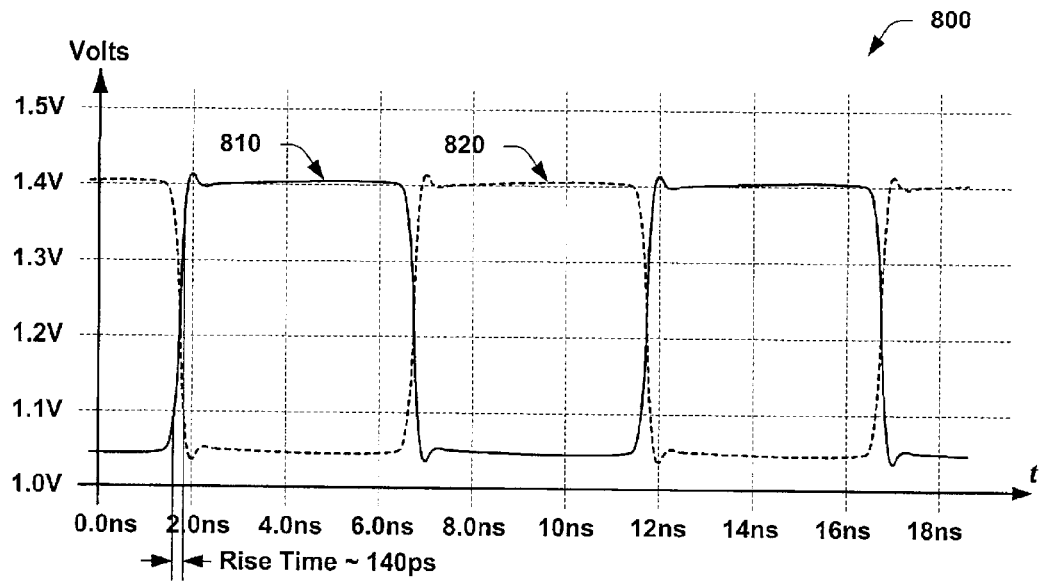
FIG. 12 is a timing diagram that illustrates the typical response of the next generation driver circuit used with a standard LVDS load at 200 Mbps, in accordance with an aspect of the invention.

FIG. 12 illustrates a typical waveform response 800 of the next generation LVDS driver circuit 500 of FIG. 9, at 200 Mbps, in accordance with an aspect of the invention. The scale and input to this circuit of the waveform 800 is identical to the waveform 300 shown in FIG. 6 for comparison to the previous generation of LVDS driver. FIG. 12 illustrates the differential output signals 810 and 820 (555 of FIG. 9), which are seen on each side of $R_{LOAD}$ (525 of FIG. 9). The differential output signals 810 and 820 (555 of FIG. 9) are centered about a common mode voltage of about 1.22 volts, have a signal swing of about 350 mV P—P, and a period of about 10 ns for a frequency of 100 MHz (200 Mbps). FIG. 12 also illustrates a typical rise/fall time of about 140 ps; easily meeting the 220 ps rise and fall time specification to conform to OC-24.

Figure 13:
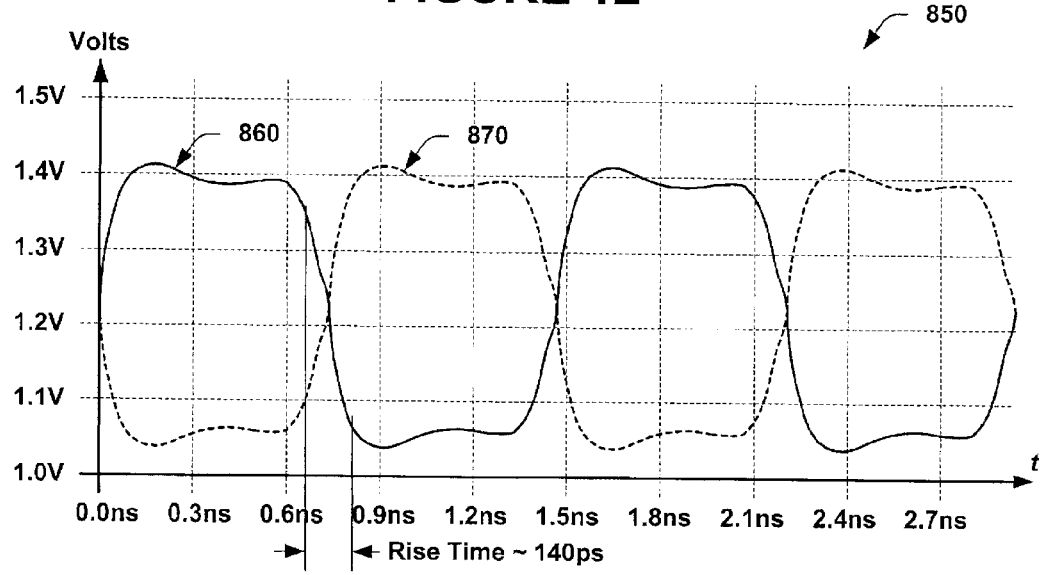
FIG. 13 is a timing diagram that illustrates the typical response of the same next generation driver circuit used with a standard LVDS load running at 1.36 Gbps, in accordance with an aspect of the present invention.

FIG. 13 illustrates the typical waveform response 850 of the same next generation LVDS driver circuit 500 of FIG. 9, running at 1.36 Gbps, in accordance with an aspect of the present invention. FIG. 13 illustrates the differential output signals 860 and 870 (555 of FIG. 9), which are seen on each side of $R_{LOAD}$ (525 of FIG. 9). The differential output signals 860 and 870 (555 of FIG. 9) are centered about a common mode voltage of about 1.23 volts, have a signal swing of about 350 mV P—P, and a period of about 1.47 ns for a frequency of 680 MHz (1.36 Gbps). FIG. 13 also illustrates a typical rise/fall time of about 140 ps, easily meeting the 220 ps rise and fall time specification for high speed (e.g., about 1.36 Gbps) data transmission to conform to OC-24.

In addition to the rise time benefits and simplified predrive, the common mode control circuit, comprising, for example, transistors Q1 and Q2, resistors R1 and R2, and the opamp A1 shown in FIG. 9, provides extremely high compliance to the common mode voltage of the output. Because the Q1 and Q2 transistors act as low impedance outputs of a voltage regulator, the common mode voltage can be very accurately controlled with high current loading conditions. One of the requirements of multipoint LVDS drivers is the ability of the circuit to maintain the common mode with a heavy DC load from multiple receivers. The circuit of FIG. 9 generally provides an order of magnitude better common mode compliance than the prior art driver circuit of FIG. 5, even with high loading due to multiple receivers.

Figure 7:
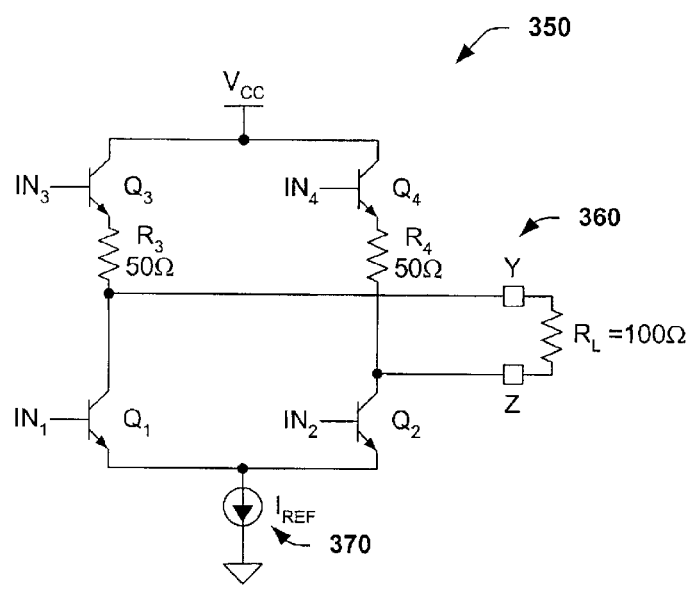
FIG. 7 is a schematic diagram that illustrates another prior art high speed repeater driver output stage in an H-Bridge type circuit configuration.
Figure 7A:
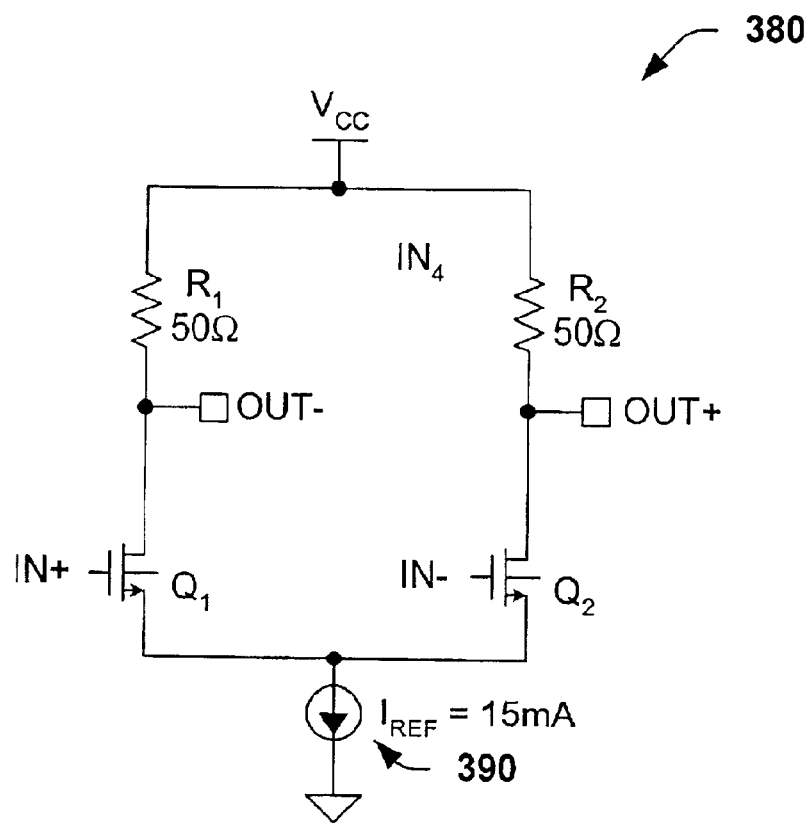
FIG. 7A is a schematic diagram illustrating a prior art standard CML driver output stage circuit.

By contrast to the conventional drive output stage circuit of FIG. 7, the present invention illustrated in FIG. 9 has another benefit of only needing two inputs from the predrive, rather than the additional predrive complexity of requiring four inputs.

Even though NMOS switching transistors have been used in this example, it will be apparent to those skilled in the art that any switching device may be used to provide high speed switching of the differential signal to meet the requirements of the speed desired. According to the present invention, an NMOS transistor sufficiently meets the rise/fall time requirement of the specifications involved.

In another variation, although a 14 mA current source has been used in the standard LVDS load example and 15 mA in the standard CML load example, it will be apparent to those skilled in the art that any level current source, or another type current limiting device may be used to provide high speed switching of the differential signal to a load. According to the present invention, a 14 mA current source (e.g., for standard LVDS load) sufficiently meets the rise/fall time requirement of the specifications involved. For example, if the rise/fall time specification was much smaller corresponding to a much greater speed, a higher Class "A" type current may be used to further increase the switching transistor slew rate, but at the cost of greater power drain and switching device heating.

In another aspect of the present invention, the amplitude of the low voltage differential input (e.g., about 1V P—P) from the predrive to the switching transistors M1 and M2 may be changed to accommodate another speed requirement. For example, a lower peak-to-peak amplitude input signal (e.g., less than 1V P—P) may be used to further limit the charge that must be dumped from the gate oxide region upon switching, permitting a higher slew rate of the input voltage and faster operation of the LVDS/CML drive circuit.

In operation of the driver circuit 500 of FIG. 9 applied to a standard LVDS load, a low voltage (e.g., about 1V P—P) differential signal is fed from a predrive circuit (e.g., 220 of FIG. 4), to differential inputs $IN_1$ and $IN_2$ of the driver circuit 500. The differential signals at $IN_1$ and $IN_2$ are applied to the gates of NMOS switching transistors M1 and M2 comprising a second output drive portion 533, that functions as a current mode switch circuit. Accordingly, switch transistors M1 and M2 alternately conduct between greater on-state currents, and lesser off-state currents, supplied by a power supply voltage and a first output drive portion 510, thru a load resistor $R_L$ 525, the second output drive portion 533, and a current source 545 to ground. Thereby, an LVDS differential signal is transmitted through a standard LVDS load resistor $R_L$ 525 at a high speed.

The first output drive portion 510, a common mode voltage monitor circuit 517, and a common mode error amplifier circuit 516, work in concert as a common mode control circuit to supply a regulated common mode voltage 520 at node "A" associated with the standard LVDS load resistor $R_L$ 525.

The common mode voltage 520 is generated across the output terminals 555, which are coupled to the load resistor $R_L$ 525. The common mode voltage monitor circuit 517 generates the common mode voltage 520 from node "A" of a resistor voltage divider comprising R1 and R2. The common mode voltage 520 is fed back to the inverting input of an opamp 540 within the common mode error amplifier circuit 516. The common mode error amplifier circuit 516 also contains a reference voltage 530 that may be generated from an internal bandgap reference voltage circuit 560. Opamp 540 compares the reference voltage 530 to the common mode voltage 520 to produce a compensation signal 542 for any correction of the common mode voltage 520.

The compensation signal 542 adjusts the impedance of NPN voltage regulator transistors Q1 and Q2 within the second output drive portion 510, which functions as a voltage mode output circuit, whereby the common mode voltage 520 is regulated. Emitter voltage dropping resistors R3 and R4, drop the excess supply voltage to the load, and permit Q1 and Q2 to operate as emitter followers to the voltage level of the compensation signal 542. As the compensation signal 542 voltage level is changed, an impedance change takes place in both Q1 and Q2, resulting in a larger current change in their emitter circuits. As the emitter currents of Q1 and Q2 change, the corresponding drain current changes in M1 and M2 cause a substantially larger change in the drain to source voltage across M1 and M2. In this way, the high speed driver circuit of the present invention provides substantially improved common mode compliance in the output applied to a standard LVDS load.

A high bandwidth driver circuit is used for data transmission in LVDS and CML transceiver device applications. The driver is capable of providing high compliance of the common mode output even at high load currents, while maintaining a simple pre-drive circuit design with a wide common mode range. An improved topology is provided for drivers specifically geared for high speed repeater applications. The methodology used involves a current loaded MOS differential pair as drive transistors, with common mode voltage controlled by NPN output transistors and a voltage reference. The circuit provides a very significant improvement in rise times: enabling 1.36 Gbps operation which is desired by many telecommunications customers, and greatly simplifies the DC biasing requirements for the predrive circuit. Additionally, the circuit provides a substantial increase in the common mode compliance of the driver. The methodology and architecture used to achieve these goals provide a significant improvement in performance over prior art.

All bipolar transistor driver output stages are used in the conventional LVDS driver circuit, because they are inherently able to operate at high speeds. The conventional LVDS driver circuit, however, require more complex biasing in the predrive circuit with a very narrow band range of input voltages in order to stay between cutoff and saturation regions. Additionally, common mode control with bipolar drivers also requires additional predrive circuitry and is very difficult, at best, over all conditions of temperature and supply voltage, poses short circuit problems, and probably will not meet the stringent requirements of the TIA/EIA-644 standard.

Class "C" type H-Bridge circuit driver output stages are used in the conventional LVDS driver circuit, because they require less energy from the power supply, and yet make a simple system. The conventional Class "C" type H-Bridge driver output stage employing MOS transistors, however, is too slow, both in overall speed and rise/fall times to conform to the high speed requirements of OC-24 and speeds up to 1.36 Gbps. The increasing use of higher speed data transmission and telecommunications devices operating up to 1.36 Gbps, such as those used in transceivers used as repeaters and converters, as well as multipoint LVDS applications, together with the new OC-24 standard for optical transmission and TIA/EIA-644, illustrates the need for a faster driver circuit capable of interchangeably transmitting a high speed CML compatible signal to a standard CML load, and a high speed LVDS compatible signal to a standard LVDS load, with excellent common mode control at high loading and a high jitter tolerance, while maintaining a simple circuit design.

Figure 14:
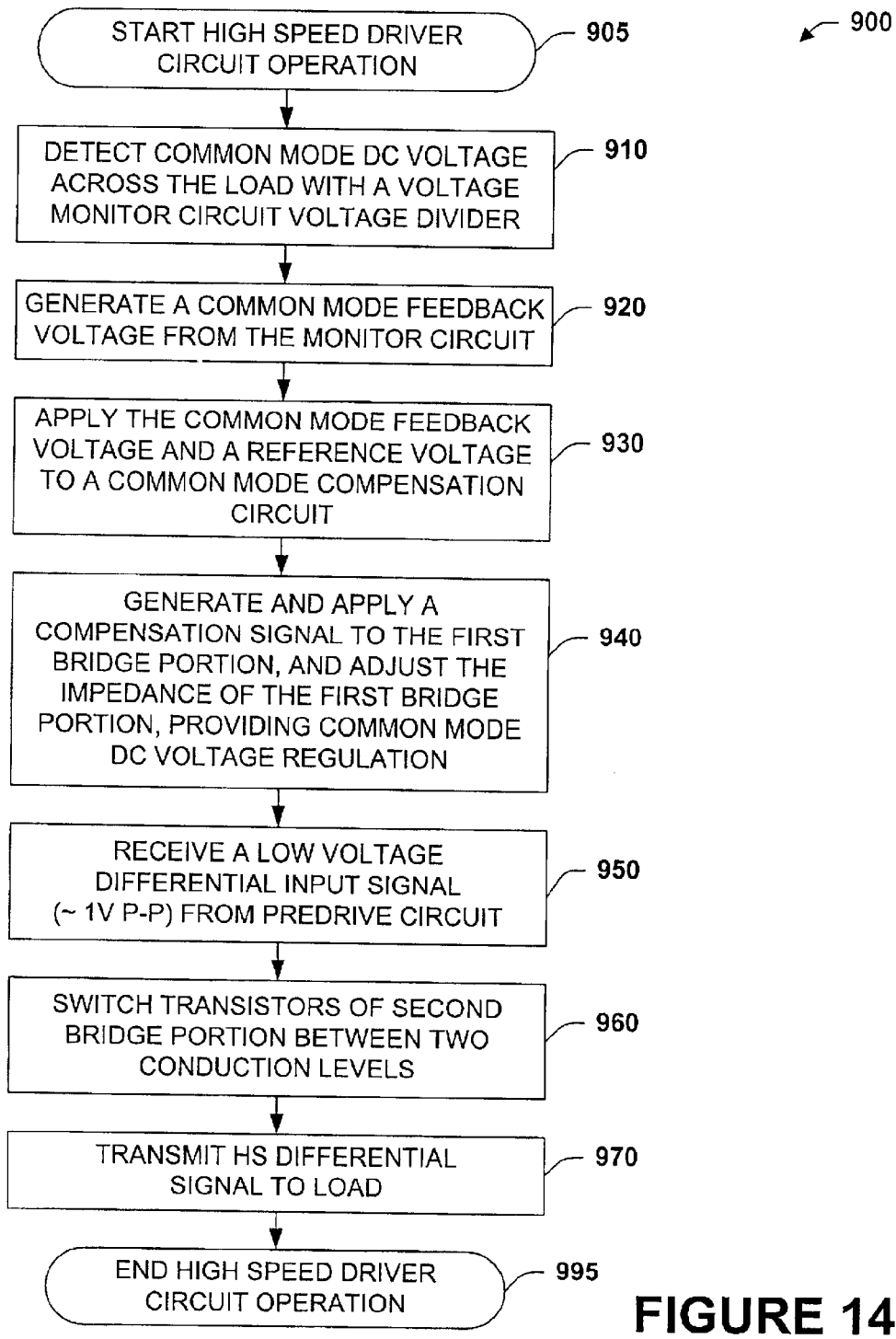
FIG. 14 is a flow diagram illustrating an exemplary method for high speed driver circuit operation in association with an aspect of the present invention.

Another aspect of the present invention provides a methodology for high speed driver circuit operation in data transmission and communications applications and the manufacture of such devices illustrated and described herein, as well as with other such devices. Referring now to FIG. 14, an exemplary method 900 is illustrated for a high speed driver circuit operation in a data transmission and communications device in association with an aspect of the present invention. While the exemplary method 900 is illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the method 900 may be implemented in association with the apparatus and systems illustrated and described herein as well as in association with other systems not illustrated.

The method 900 comprises detecting a common mode DC voltage associated with a load with a voltage divider of a voltage monitoring circuit, for example, monitoring a high speed differential signal transmitted to a load resistor which is, for example, within the front end of an external receiver circuit. The voltage monitoring circuit feeds the detected common mode voltage back to a common mode error amplifier circuit, wherein the common mode voltage is compared to a reference voltage which is generated by, for example, a bandgap reference circuit. An opamp within the common mode error amplifier circuit determines whether, and the extent to which, the common mode voltage is greater or less than the reference voltage. The results of the comparison are then used to adjust the output of the level of a compensation signal, apply the compensation signal to a first output drive portion which operates as a voltage mode output circuit, to use this compensation signal level to adjust the impedance of two bipolar transistors in the first output drive portion.

The transistors of the first output drive portion are then used to regulate the common mode voltage of the driver circuit based upon the compensation signal derived from the common mode voltage associated with the load resistor. A low voltage differential signal is also received from a predrive circuit to differential inputs of a second output drive portion. MOS transistors within the second output drive portion receive the differential signal inputs, and alternately conduct between greater on-state currents, and lesser off-state currents, supplied by a power supply voltage and a first output drive portion, thru a load resistor $R_L$, the second output drive portion, and a current source to ground. Thereby, a differential signal is transmitted through a load resistor $R_L$ at a high speed.

The high speed driver circuit operation method begins at 905. At 910 a high speed differential signal is monitored by the voltage divider of a voltage monitor circuit, for example, as an output of a differential driver circuit used for data transmission and communications applications. At 920 a common mode voltage is generated from the voltage monitor circuit. The common mode voltage and a reference voltage are applied as inputs to a common mode compensation circuit at 930.

The common mode voltage and the reference voltage are compared at 940, and compensation signal is generated and applied to the first output drive portion which adjusts the impedance of the output circuit thereby regulating the common mode voltage.

A low voltage differential signal (e.g., about 1V P—P) is also received from a predrive circuit at 950, to differential inputs of a second output drive portion. At 960 MOS transistors within the second output drive portion receive the differential signal inputs, and alternately conduct between greater on-state currents, and lesser off-state currents thru a load resistor $R_L$.

Thereafter at 970, a high speed differential signal is transmitted to a load, from a high bandwidth driver circuit with excellent common mode control and a high jitter tolerance, while maintaining a simple circuit design in a high speed data transmission and telecommunications device operating up to 1.36 Gbps. At 970, a determination may also be made whether the high speed driver circuit operation is still enabled. If the operation is still enabled, the high speed driver circuit operation continues at 910, otherwise the operation thereafter ends at 995, and the method 900 may be repeated for subsequent high speed driver circuit operations of a communications device for transmitting a high speed CML compatible signal to a standard CML load, and a high speed LVDS compatible signal to a standard LVDS load.

Figure 15:
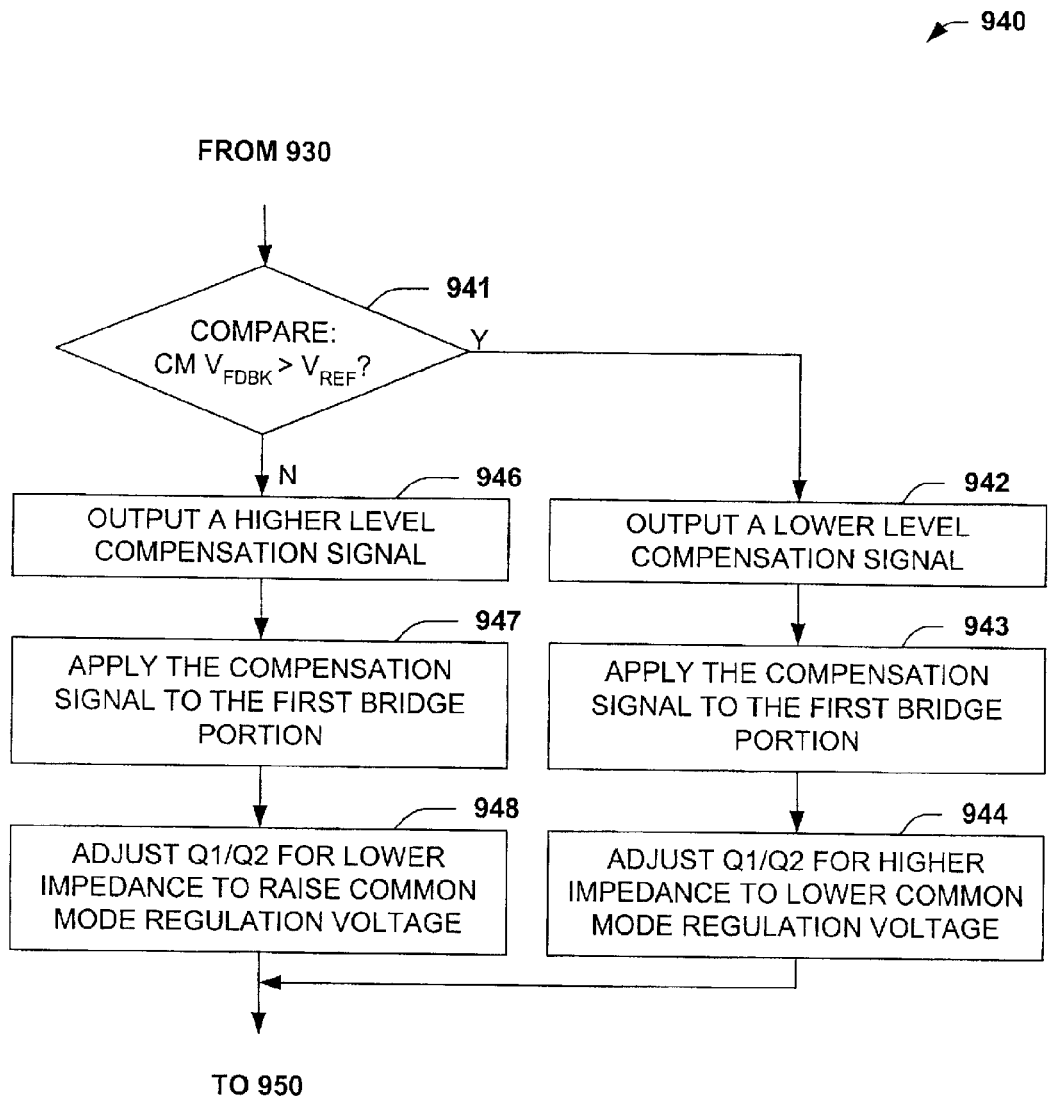
FIG. 15 is a flow diagram illustrating an exemplary method for the compensation signal generation and common mode regulation at 940 of FIG. 14 for the high speed driver circuit operation in association with an aspect of the present invention.

FIG. 15 is a flow diagram illustrating an exemplary method for the compensation signal generation and common mode voltage regulation at 940 of the method 900 of FIG. 14 for the high speed driver circuit operation in association with an aspect of the present invention. The compensation signal generation and common mode voltage regulation operation of 940, hereinafter begins with 941, where a determination is made whether the common mode voltage is greater than a reference voltage. If the result of the comparison at 941 indicates that the common mode voltage is greater than the reference voltage (e.g., >about 1.2V), then a lower compensation level is output from the common mode compensation circuit at 942, and at 943 the reduced compensation signal is applied to the first output drive portion. At 944, the impedance of the two bipolar transistors in the first output drive portion is increased to regulate the common mode voltage to a lower value, and the method 940 continues back to FIGS. 14 and 950.

However, if the determination is made at 941 that the common mode voltage is less than the reference voltage, then a higher compensation level is output from the common mode compensation circuit at 942, and at 947 the increased compensation signal is applied to the first output drive portion. Finally, at 948, the impedance of the two bipolar transistors in the first output drive portion is decreased to regulate the common mode voltage to a higher value, and the method 940 continues back to FIGS. 14 and 950.

The methodology 900 thus provides for a high speed driver circuit used in data transmission and communications applications and the manufacture of such devices, in which the driver circuit uses a low voltage differential signal input from a predrive circuit to switch MOS transistors in a first output drive portion of an output circuit, which are used to alternately conduct between lower current off-states and higher current on-states therethrough a load resistor, and a common mode compensation circuit and a second output drive portion of an output circuit, which together, provide a compensation signal for two transistors of the second output drive portion to vary the impedance of the second output drive portion, thereby regulating the common mode voltage of the driver circuit based on a common mode DC voltage associated with a load, wherein the compensation signal is derived by monitoring, for example, a high speed differential signal transmitted to a load resistor which is, for example, within the front end of an external receiver circuit, thereby producing a driver circuit with excellent common mode control and a high jitter tolerance, while maintaining a simple circuit design in a high speed data transmission and telecommunications device operating up to 1.36 Gbps. Other variants of methodologies may be provided in accordance with the present invention, whereby high speed driver circuit operation is accomplished employing a common mode control which directly controls bipolar drive stage transistors of a first output drive portion of the output circuit, which function as low impedance voltage regulators of a voltage mode control circuit, and MOS transistors as current limiting switching elements in a second output drive portion, which function as a current mode control circuit.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (Le., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A driver circuit for driving a load with a differential signal, comprising:

a first output drive portion operably coupled to a power supply rail;

a second output drive portion coupled to the first output drive portion, a low voltage differential input signal, and further comprising output terminals coupled to the load, and operably coupled with a current source, wherein the second output drive portion is operable to switch alternate polarity terminals of the load to the current source; and a common mode compensation circuit coupled to the output terminals of the second output drive portion and the first output drive portion, wherein the common mode compensation circuit is operable to detect a common mode voltage associated with the load and generate a compensation signal in response thereto, wherein the first output drive portion is operable to vary an impedance associated therewith in response to the compensation signal, thereby regulating a common mode voltage associated with the load, whereby the differential signal is transmitted to the load at a high rate of speed with a high compliance of the common mode output even at high current loading conditions, while maintaining a pre-drive circuit with a wide common mode range, wherein both when the load is a standard LVDS load, the load is driven by a standard LVDS compatible output, and when the load is a standard CML load, the load is driven by a standard CML compatible output.

2. The system of claim 1, wherein the first output drive portion of the driver circuit comprises;

two bipolar transistors coupled in an emitter follower configuration, having a collector terminal of each bipolar transistor connected to the supply voltage, and a base terminal of each bipolar transistor connected together and to the compensation signal from the common mode compensation circuit, whereby the common mode compensation circuit is operable to vary the impedance associated with each bipolar transistor of the first output drive portion based on the compensation signal in response to the common mode voltage from the load; and two voltage dropping resistors associated with the two bipolar transistors, respectively, with a first terminal connected to an emitter of one of the bipolar transistors, and a second terminal coupled to the load and the second output drive portion of the driver circuit, respectively.

3. The system of claim 1, wherein the power supply rail is a positive voltage.

4. The system of claim 1, wherein the second output drive portion comprises:

two switching transistors individually adapted to receive one input of the low voltage differential input signal into a first terminal of one of the switching transistors, to couple a first terminal of the current source to a second terminal of each switching transistor, and wherein the first output drive portion and the load are coupled to a third terminal of the switching transistor, whereby the second output drive portion is operable to switch alternate polarity terminals of the load to the current source; and the current source has a second terminal coupled with one of a power supply rail and ground, and is operable to set and supply a circuit current for the second output drive portion, whereby a differential signal, may be transmitted to the load at a high rate of speed.

5. The system of claim 4, wherein one of the switching transistors comprises a MOS transistor.

6. The system of claim 4, wherein one of the switching transistors comprises an NMOS transistor.

7. The system of claim 1, wherein the common mode compensation circuit comprises:

a common mode voltage monitor circuit operable to provide the common mode voltage associated with a node of a voltage divider coupled across the output terminals for the load; and a common mode error amplifier circuit operable to receive a reference voltage input and the common mode voltage from the common mode voltage monitor circuit, and generate a compensation signal to the first output drive portion in response thereto, whereby the impedance of the first output drive portion is adjusted such that voltage regulation of the common mode dc voltage is provided.

8. The system of claim 7, wherein the voltage divider comprises two series connected resistors of about the same value.

9. The system of claim 7, wherein the common mode error amplifier circuit comprises:

a reference voltage circuit operable to generate a reference voltage; and an operational amplifier operable to receive the reference voltage at a non-inverting input and the common mode voltage at an inverting input of the operational amplifier, and further operable to generate the compensation signal to the first output drive portion, whereby the impedance of the first output drive portion is adjusted.

10. The system of claim 9, wherein the reference voltage circuit generates a reference voltage of about 1.2 volts.

11. A driver circuit for driving a load with a differential signal, comprising:

a voltage mode output circuit operably coupled to a power supply rail;

a current mode switch circuit coupled to the voltage mode output circuit, a low voltage differential input signal, and further comprising output terminals coupled to the load, and operably coupled with a current source, wherein the current mode switch circuit is operable to switch alternate polarity terminals of the load to the current source; and a common mode compensation circuit coupled to the output terminals of the current mode switch circuit and the voltage mode output circuit, wherein the common mode compensation circuit is operable to detect a common mode voltage associated with the load and generate a compensation signal in response thereto, and wherein the voltage mode output circuit is operable to vary an impedance associated therewith in response to the compensation signal, thereby regulating a common mode voltage associated with the load, whereby the differential signal is transmitted to the load at a high rate of speed with a high compliance of the common mode output even at high current loading conditions, while maintaining a pre-drive circuit with a wide common mode range, wherein both when the load is a standard LVDS load, the load is driven by a standard LVDS compatible output, and when the load is a standard CML load, the load is driven by a standard CML compatible output.

12. The system of claim 11, wherein the current mode switch circuit comprises two switching transistors which are operable to alternately conduct between an on-state current and an off-state current respectively, whereby the differential signal is transmitted to the load at a high rate of speed.

13. The system of claim 12, wherein the on-state current is greater than the off-state current.

14. The system of claim 12, wherein the off-state current is greater than zero.

15. The system of claim 11, wherein the voltage mode output circuit of the driver circuit and the common mode compensation circuit comprises a low impedance voltage regulator circuit, whereby the common mode voltage associated with the load is regulated.

16. A method of driving a differential signal for high speed data transmission in transceiver, converter, and repeater devices comprising:

detecting a dc voltage associated with the differential signal across a load with a common mode voltage monitor circuit to provide a common mode voltage associated with a node of a voltage divider coupled across the terminals of the load;

applying the common mode voltage and a reference voltage to a common mode compensation circuit;

generating a compensation signal based on the common mode voltage and the reference voltage;

applying the compensation signal to a voltage mode output circuit;

adjusting the impedance of the voltage mode output circuit in response to the compensation signal, thereby regulating the common mode voltage associated with the load at a level set by the reference voltage;

inputting a low voltage differential input signal from a pre-drive circuit and the voltage regulated output from the voltage mode output circuit, into a second output drive portion;

driving said load by both a standard LVDS compatible output when the load is a standard LVDS load and a standard CML compatible output when the load is standard CML compatible output, switching the transistors of the current mode switch circuit in response to the low voltage differential input signal, between low and high conduction levels established by the voltage mode output circuit impedance and a current source, thereby conducting a current which flows from the voltage mode output circuit, thru the load, and the current mode switch circuit, and a current which flows thru the voltage mode output circuit and the current mode switch circuit; and transmitting a differential signal to the load at a high rate of speed, with a high compliance of the common mode output even at high current loading conditions, while maintaining a simple pre-drive circuit design with a wide common mode range.

* * * * *